United States Patent
Fang et al.

(10) Patent No.: US 11,605,597 B2
(45) Date of Patent: Mar. 14, 2023

(54) SEMICONDUCTOR PACKAGE STRUCTURE AND METHOD FOR MANUFACTURING THE SAME

(71) Applicant: Advanced Semiconductor Engineering, Inc., Kaohsiung (TW)

(72) Inventors: Hsu-Nan Fang, Kaohsiung (TW); Chun-Jun Zhuang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 55 days.

(21) Appl. No.: 16/852,259

(22) Filed: Apr. 17, 2020

(65) Prior Publication Data
US 2021/0327819 A1 Oct. 21, 2021

(51) Int. Cl.
| | |
|---|---|
| *H01L 23/544* | (2006.01) |
| *H01L 23/31* | (2006.01) |
| *H01L 23/00* | (2006.01) |
| *H01L 21/56* | (2006.01) |
| *H01L 23/18* | (2006.01) |
| *H01L 27/148* | (2006.01) |

(52) U.S. Cl.
CPC .......... *H01L 23/544* (2013.01); *H01L 21/56* (2013.01); *H01L 23/18* (2013.01); *H01L 23/3114* (2013.01); *H01L 24/05* (2013.01); *H01L 27/148* (2013.01); *H01L 2223/54426* (2013.01); *H01L 2224/0401* (2013.01); *H01L 2224/04105* (2013.01); *H01L 2224/05022* (2013.01); *H01L 2924/181* (2013.01)

(58) Field of Classification Search
None
See application file for complete search history.

(56) References Cited

U.S. PATENT DOCUMENTS

| | | | | |
|---|---|---|---|---|
| 2015/0348904 | A1* | 12/2015 | Huang | H01L 23/5383 438/666 |
| 2018/0151507 | A1* | 5/2018 | Chen | H01L 21/565 |
| 2019/0333862 | A1* | 10/2019 | Wang | H01L 23/5383 |
| 2019/0355679 | A1* | 11/2019 | Wu | H01L 23/3135 |
| 2019/0385975 | A1* | 12/2019 | Wang | H01L 21/6835 |
| 2020/0006164 | A1* | 1/2020 | Yu | H01L 25/50 |
| 2021/0125936 | A1* | 4/2021 | Wang | H01L 24/03 |

* cited by examiner

*Primary Examiner* — Jay C Chang
(74) *Attorney, Agent, or Firm* — Foley & Lardner LLP

(57) ABSTRACT

A semiconductor package structure and a method for manufacturing a semiconductor package structure are provided. The semiconductor package structure includes a first passivation layer, a first metal layer and a first semiconductor die. The first metal layer is embedded in the first passivation layer. The first metal layer defines a first through-hole. The first semiconductor die is disposed on the first passivation layer.

17 Claims, 24 Drawing Sheets

SEMICONDUCTOR PACKAGE STRUCTURE AND METHOD FOR MANUFACTURING THE SAME

BACKGROUND

1. Field of the Disclosure

The present disclosure relates to a semiconductor package structure and a method, and to a semiconductor package structure including an alignment mark.

2. Description of the Related Art

Conventionally, a copper layer with special profile may be used as an alignment mark in a semiconductor package structure. However, the lateral side surface of the alignment mark is not a vertical plane, thus, the edge of the alignment mark may result in halation in charge-coupled device (CCD) images. A recess, for example, formed by etching a passivation layer, with special profile may also be used as an alignment mark. However, copper is exposed to air from the recess, which causes copper to be oxidized as copper oxide so that CCD cannot identify where the alignment mark is.

In addition, a plating process is used to build bumps on the etched passivation layer. Since the plating process involves a warpage problem and thus reduces process windows, a ball drop process replaces the plating process. However, the alignment mark is hidden by pad, and thus makes it is difficult to perform the ball drop process. Therefore, a new semiconductor package structure is required to solve above problems.

SUMMARY

In some embodiments, a semiconductor package structure includes a first passivation layer, a first metal layer and a first semiconductor die. The first metal layer is embedded in the first passivation layer. The first metal layer defines a first through-hole. The first semiconductor die is disposed on the first passivation layer.

In some embodiments, a method for manufacturing a semiconductor package structure includes: (a) providing a carrier; (b) forming a metal layer on the carrier; (c) patterning the metal layer to form a through-hole exposing a portion of the carrier; (d) forming a passivation layer on the metal layer, the passivation layer having a first surface and a second surface opposite to the first surface; (e) removing the carrier; and (f) bonding a first semiconductor die on the first surface of the passivation layer.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
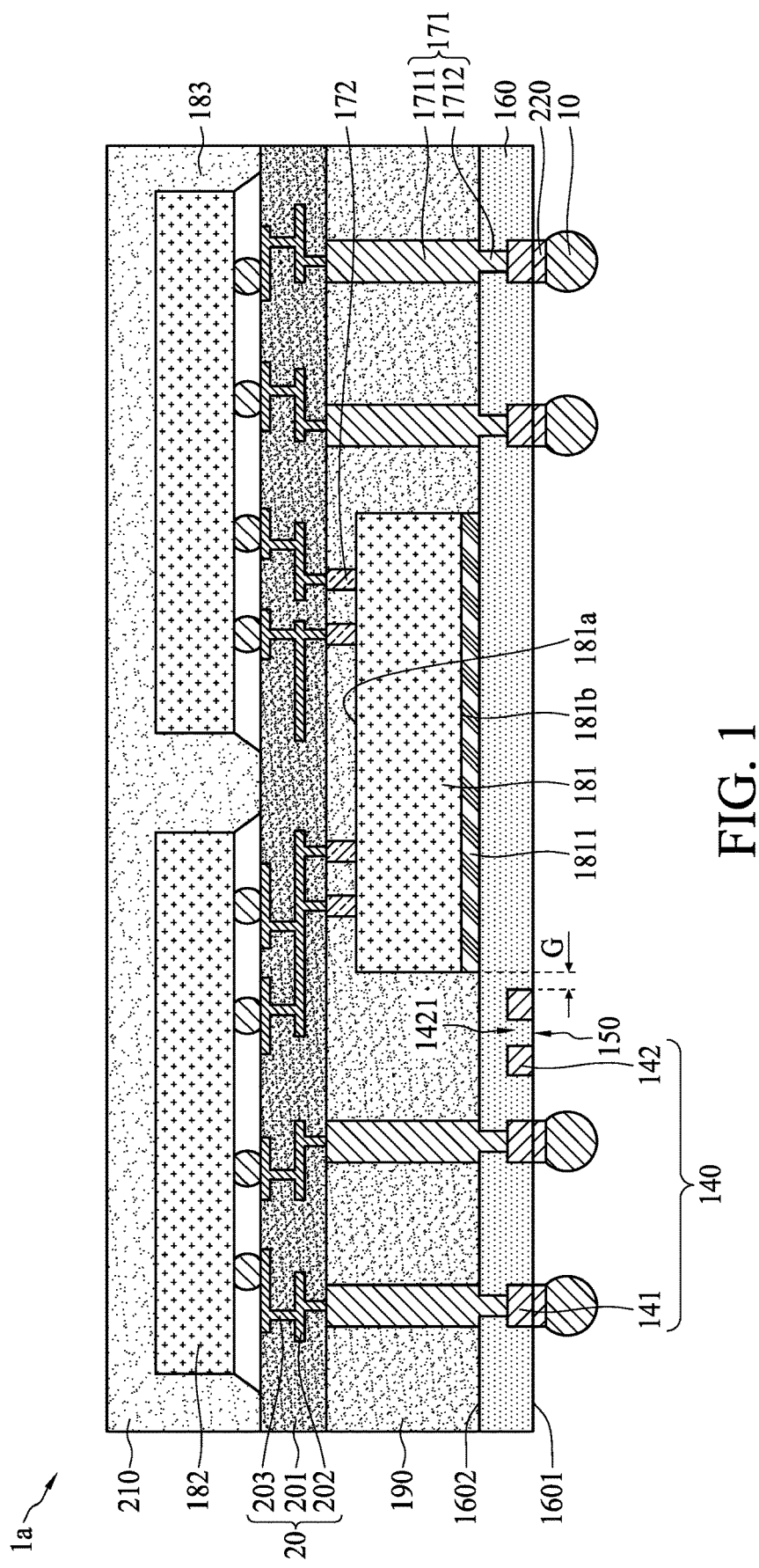
FIG. 1 illustrates a cross-sectional view of an example of a semiconductor package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 illustrates a cross-sectional view of an example of a semiconductor package structure 1a according to some embodiments of the present disclosure. The semiconductor package structure 1a may include a first passivation layer 160, a first semiconductor die 181, a first metal layer 140, an encapsulant 190, at least one conductive pillar 171, at least one conductive bump 172, a second semiconductor die 182, a third semiconductor die 183, a redistribution structure 20, a protection layer 210, at least one bonding pad 220, and at least one conductive terminal 10.

The first passivation layer 160 may include a first surface 1601 and a second surface 1602. The first surface 1601 is opposite to the second surface 1602. The first surface 1601 may also be referred to as a bottom surface of the first passivation layer 160. The second surface 1602 may also be referred to as an upper surface of the first passivation layer 160. The first passivation layer 160 is configured to protect a metal layer, such as the first metal layer 140, from damage. In some embodiments, the first passivation layer 160 may include a benzocyclobutene (BCB) based polymer or a polyimide (PI). In some embodiments, the thickness of the first passivation layer 160 ranges, but is not limited to, from about 1 μm to about 5 μm. In some embodiments, a material of the first passivation layer 160 may be transparent, and can be seen through or detected by human eyes or machine (e.g., charge-coupled device (CCD)). That is, a mark (e.g., an alignment mark 150 of an alignment mark portion 142 of the first metal layer 140) disposed adjacent to the first surface 1601 of the first passivation layer 160 can be recognized or detected from the second surface 1602 of the first passivation layer 160 by human eyes or machine (e.g., CCD). In some embodiments, a transparent material of the first passivation layer 160 has a light transmission for a wavelength in the visible range (or other pertinent wavelength for detection of a mark) of at least about 60%, at least about 70%, or at least about 80%.

The first semiconductor die 181 may be disposed on the first passivation layer 160. In some embodiments, the first semiconductor die 181 may be disposed on the second surface 1602 of the first passivation layer 160. In some embodiments, the first semiconductor die 181 may be a bridge die. In some embodiments, the first semiconductor die 181 may include a high-level data link control (HDLC) chip. As shown in FIG. 1, the first semiconductor die 181 may have a first surface 181a (e.g., an active surface) and a second surface 181b (e.g., a backside surface) opposite to the first surface 181a. The second surface 181b of the first semiconductor die 181 may be attached to the second surface 1602 of the first passivation layer 160 through an adhesion layer 1811.

The first metal layer 140 may be embedded in the first passivation layer 160. The first metal layer 140 may be disposed on the second surface 1602 of the first passivation layer 160. In some embodiments, the first metal layer 140 may include, for example, copper, another conductive metal, or an alloy thereof. In some embodiments, the bottom surface of the first metal layer 140 is substantially coplanar with the first surface 1601 of the first passivation layer 160. The first metal layer 140 may include a circuit portion 141 and an alignment mark portion 142.

The circuit portion 141 may be used to electrically connect conductive elements. That is, the circuit portion 141 may have electrical function. For example, the circuit portion 141 of the first metal layer 140 may electrically connect the second semiconductor die 182 and the conductive terminal 10 through the conductive pillar 171, the redistribution structure 20 and the bonding pad 220.

The alignment mark portion 142 may be disposed adjacent to the first semiconductor die 181. In some embodiments, the alignment mark portion 142 may be disposed between the circuit portion 141 and the first semiconductor die 181. In some embodiments, a side (e.g., a bottom side) of the alignment mark portion 142 may be exposed to air, while the other side (e.g., a top side) of the alignment mark portion 142 is embedded in the first passivation layer 160. In some embodiments, a side (e.g., a bottom side) of the alignment mark portion 142 may be exposed from the first surface 1601 of the first passivation layer 160. In some embodiments, the alignment mark portion 142 may be not physically connected and electrically connected to the circuit portion 141, the first semiconductor die 181 and/or the second semiconductor die 182. That is, the alignment mark portion 142 may be dummy, and may have no electrical function. In some embodiments, a horizontal gap is between the first metal layer 140 and the first semiconductor die 181. In some embodiments, a horizontal gap G is between the alignment mark portion 142 of the first metal layer 140 and the first semiconductor die 181. Thus, the alignment mark portion 142 may not be disposed at a position right under the first semiconductor die 181. For example, the gap G may be less than 0.5 times a width of the alignment mark portion 142. As shown in FIG. 1, the circuit portion 141 may not extend to the position right under the first semiconductor die 181. However, in some embodiments, the circuit portion 141 may extend to the position right under the first semiconductor die 181.

In some embodiments, the alignment mark portion 142 may define a first through-hole 1421. In some embodiments, the semiconductor package structure 1a may include an alignment mark 150 defined by the first through-hole 1421. The first through-hole 1421 may serve as an alignment mark during the attaching process of the first semiconductor die 181. The first through-hole 1421 may be surrounded by the alignment mark portion 142 of the first metal layer 140 so that the alignment mark 150 is an enclosed space from a top view. The first passivation layer 160 may fill into the first through-hole 1421.

The conductive pillar 171 may be disposed on the circuit portion 141 of the first metal layer 140. The conductive pillar 171 may include a main portion 1711 and a bottom portion 1712. The main portion 1711 of the conductive pillar 171 may extend through or penetrate the encapsulant 190 to contact or electrically connect the redistribution structure 20. The bottom portion 1712 of the conductive pillar 171 may penetrate or extend through the first passivation layer 160 to contact or electrically connect the circuit portion 141 of the first metal layer 140. A diameter of the main portion 1711 of the conductive pillar 171 may be greater than a diameter of the bottom portion 1712 of the conductive pillar 171. The conductive pillar 171 may be used to electrically connect, for example, the circuit portion 141 of the first metal layer 140 and the second semiconductor die 182 and/or the third semiconductor die 183 through the redistribution structure 20. The conductive pillar 171 may include, for example, copper, another conductive metal, or an alloy thereof. In some embodiments, the profile of the conductive pillar 171 differs from that of the first through-hole 1421 from a top view.

The conductive bump 172 may be disposed on the first surface 181a (e.g., the active surface) of the first semiconductor die 181 and embedded in the encapsulant 190. The conductive bump 172 may contact or electrically connect the redistribution structure 20. The conductive bump 172 may be electrically connected to the second semiconductor die 182 and the third semiconductor die 183 through the redistribution structure 20. The conductive bump 172 may include, for example, copper, another conductive metal, or an alloy thereof.

The encapsulant 190 may be disposed on the second surface 1602 of the first passivation layer 160. The encapsulant 190 may cover the first passivation layer 160. The encapsulant 190 may cover the first semiconductor die 181, the conductive pillar 171 and the conductive bump 172. A top surface of the encapsulant 190 may be coplanar with a top surface of the conductive pillar 171 and a top surface of the conductive bump 172. The encapsulant 190 may include insulation or dielectric material. In some embodiments, the material of the encapsulant 190 differs from that of the first passivation layer 160. In some embodiments, the encapsulant 190 is made of molding material that may include, for example, a Novolac-based resin, an epoxy-based resin, a silicone-based resin, or other another suitable encapsulant. Suitable fillers may also be included, such as powdered $SiO_2$.

The redistribution structure 20 may be disposed on the encapsulant 190. The redistribution structure 20 may include a dielectric structure 201, at least one redistribution layer 202 and a plurality of vias 203 embedded in the dielectric structure 201. The redistribution structure 20 may be used to electrically connect, for example, the second semiconductor die 182, the third semiconductor die 183 and the first semiconductor die 181.

The second semiconductor die 182 and/or the third semiconductor die 183 may be disposed on and electrically connected to the redistribution structure 20. The second semiconductor die 182 and/or the third semiconductor die 183 may be disposed above the first semiconductor die 181. The second semiconductor die 182 may be, for example, an application specific integrated circuit (ASIC). The third semiconductor die 183 may be, for example, a high bandwidth memory (HBM). The second semiconductor die 182 may be electrically connected to the third semiconductor die 183 through the first semiconductor die 181.

The protection layer 210 may be disposed on the redistribution structure 20. The protection layer 210 may cover the second semiconductor die 182 and/or the third semiconductor die 183. In some embodiments, the protection layer 210 is made of molding material that may include, for example, may include a Novolac-based resin, an epoxy-based resin, a silicone-based resin, or other another suitable encapsulant.

The bonding pad 220 may be disposed on the first surface 1601 of the first passivation layer 160. The bonding pad 220 may be in contact with the circuit portion 141 of the first metal layer 140. The bonding pad 220 may not contact the alignment mark portion 142 of the first metal layer 140. The bonding pad 220 may include, for example, copper, another conductive metal, or an alloy thereof. In some embodiments, the bonding pad 220 may be omitted.

The conductive terminal 10 may include, for example, a solder bump or a solder ball. The conductive terminal 10 may be disposed on the bonding pad 220. The conductive terminal 10 may be disposed adjacent to the first surface 1601 of the first passivation layer 160 for external connection. In some embodiments, the conductive terminal 10 may be in contact with the circuit portion 141 of the first metal layer 140. In some embodiments, the conductive terminal 10 may be electrically connected to the circuit portion 141 of the first metal layer 140. In some embodiments, the conductive terminal 10 may not be electrically connected to the alignment mark portion 142 of the first metal layer 140. In some embodiments, the conductive terminal 10 may be electrically connected to the second semiconductor die 182 or the third semiconductor die 183 through the conductive pillar 171 and the redistribution structure 20. The conductive terminal 10 may include, for example, AgSn, another conductive metal, or an alloy thereof.

In a comparative semiconductor package structure, an alignment mark is made of a metal layer protruding from a passivation layer. This design results in halation in CCD images, which reduces accuracy during bonding semiconductor dies. In the embodiment of the present disclosure illustrated in FIG. 1, the first through-hole 1421, defined by the alignment mark portion 142 of the first metal layer 140, can serve as an alignment mark. The first metal layer 140 is embedded in the first passivation layer 160, which can reduce halation in CCD images. Therefore, accuracy of bonding semiconductor dies, such as the first semiconductor die 181, is improved.

In another comparative semiconductor package structure, an alignment mark is defined by a metal layer exposed from a passivation layer, causing copper to be easily oxidized as copper oxide. In a CCD image, color of copper oxide has few differences in comparison with that of the passivation layer so that CCD cannot identify where the alignment mark is. In the embodiment of the present disclosure illustrated in FIG. 1, the first through-hole 1421, defined by the alignment mark portion 142 of the first metal layer 140, can serve as an alignment mark. Since the first metal layer 140 is embedded in the first passivation layer 160, the first metal layer 140 is much more difficult to be oxidized. Therefore, accuracy of bonding semiconductor dies, such as the first semiconductor die 181, is improved.

In the embodiment illustrated in FIG. 1, the alignment mark portion 142 of the first metal layer 140 is exposed from the first surface 1601 of the first passivation layer 160. During the formation of the conductive terminal 10, the first through-hole 1421 can also serve as an alignment mark, making the formation of conductive terminal 10 with a ball drop process possible. Therefore, a plating process, which is involved in warpage problems, may be replaced by the ball drop process.

Figure 2:
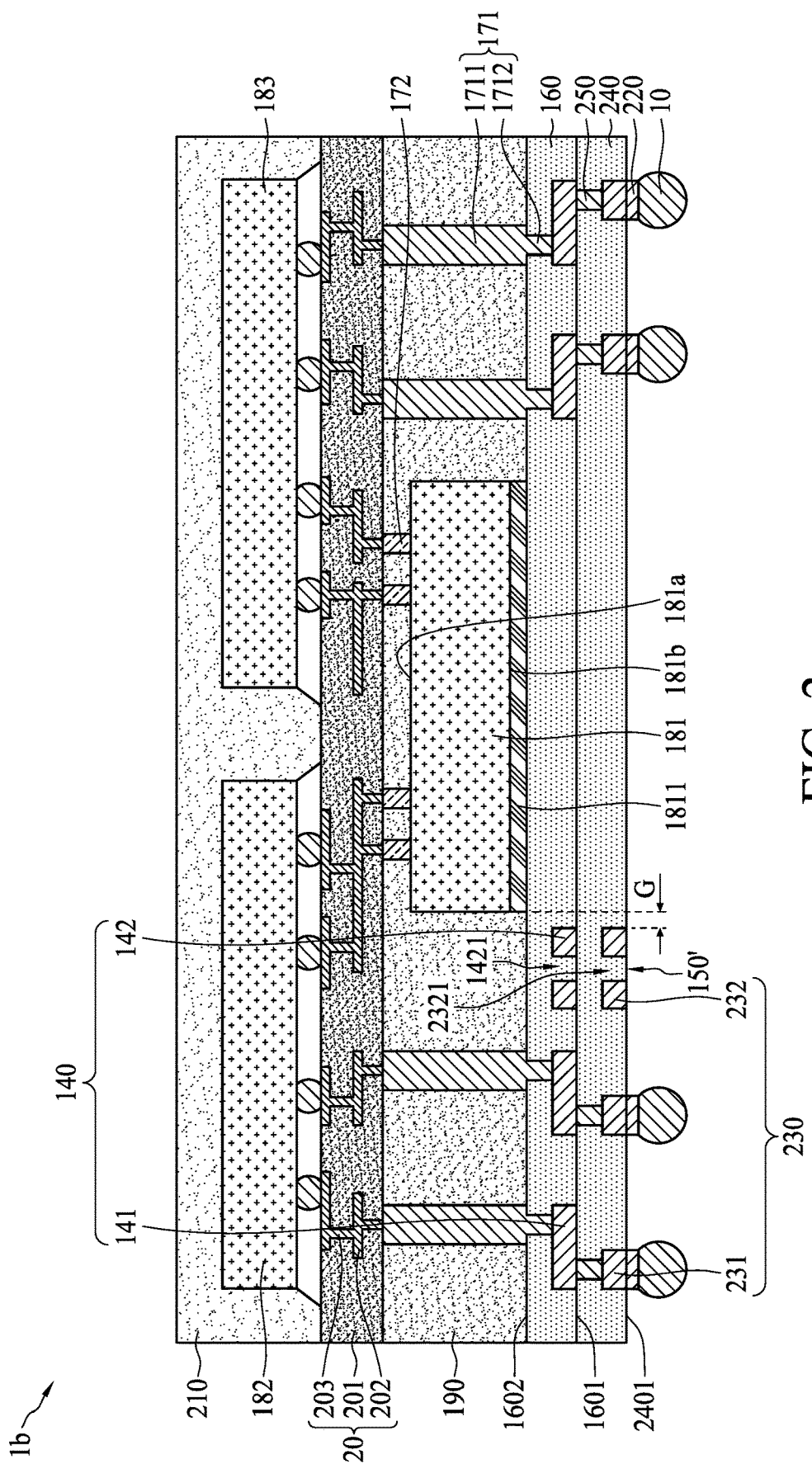
FIG. 2 illustrates a cross-sectional view of an example of a semiconductor package structure according to some embodiments of the present disclosure.

FIG. 2 illustrates a cross-sectional view of an example of a semiconductor package structure 1b according to some embodiments of the present disclosure. The semiconductor package structure 1b of FIG. 2 has a structure similar to that of the semiconductor package structure 1a of FIG. 1 with differences that the semiconductor package structure 1b further includes an alignment mark 150' replacing with the alignment mark 150.

In some embodiments, the semiconductor package structure 1b may further include a second metal layer 230 and a second passivation layer 240. In some embodiments, the second passivation layer 240 is disposed on the first surface 1601 of the first passivation layer 160. The material of the second passivation layer 240 may be similar to or the same as that of the first passivation layer 160. The second passivation layer 240 may have a first surface 2401 far from the first surface 1601 of the first passivation layer 160. The first surface 2401 may also be referred to as a bottom surface of the second passivation layer 240.

In some embodiments, the second metal layer 230 may be embedded in the second passivation layer 240. In some embodiments, the bottom surface of the second metal layer 230 may be coplanar with the first surface 2401 of the second passivation layer 240. In some embodiments, the second metal layer 230 may include, for example, copper, another conductive metal, or an alloy thereof. The second metal layer 230 may include a circuit portion 231 and an alignment mark portion 232.

The circuit portion 231 may be used to electrically connect conductive elements, such as the conductive terminal 10 and the second semiconductor die 182. That is, the circuit portion 231 may have electrical function. In some embodiments, the circuit portion 231 of the second metal layer 230 may be electrically connected to the circuit portion 141 of the first metal layer 140. The circuit portion 231 may be electrically connected to the circuit portion 141 by a conductive via 250. In some embodiments, the circuit portion 231 of the second metal layer 230 may not be aligned to the conductive pillar 171. The via 250 may not be aligned to the conductive pillar 171. Thus, the circuit portion 141 of the first metal layer 140 may be a fan-out circuit layer.

The alignment mark portion 232 may be disposed adjacent to the first semiconductor die 181. In some embodiments, the alignment mark portion 232 may be disposed between the circuit portion 231 and the first semiconductor die 181. In some embodiments, a side (e.g., a bottom side) of the alignment mark portion 232 may be exposed to air, while the other side (e.g., a top side) is embedded in the second passivation layer 240. In some embodiments, a side (e.g., a bottom side) of the alignment mark portion 232 may be exposed from the first surface 2401 of the second passivation layer 240. In some embodiments, the alignment mark portion 232 may not be electrically connected to the alignment mark portion 142. That is, the alignment portion 232 may be dummy, and may have no electrical function. In some embodiments, the alignment mark portion 232 may be aligned to the alignment mark portion 142.

In some embodiments, the alignment mark portion 232 may define a second through-hole 2321. In some embodiments, the second through-hole 2321 may be aligned to the first through-hole 1421. In some embodiments, the alignment mark 150' is defined by the through-holes 1421 and 2321. The through-holes 1421 and 2321 may be used as an alignment mark during the attaching process of the first semiconductor die 181. The second through-hole 2321 may be surrounded by the alignment mark portion 232 of the second metal layer 230. The second passivation layer 240 may fill into the second through-hole 2321 of the alignment mark portion 232.

Figure 3:
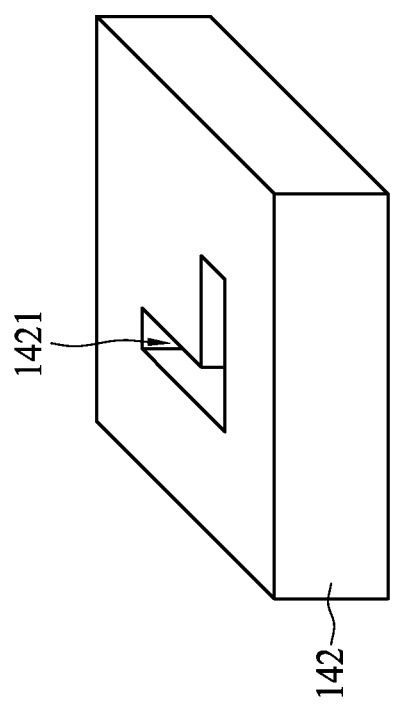
FIG. 3 illustrates a perspective view of an example of an alignment mark portion of FIG. 1.

FIG. 3 illustrates a perspective view of an example of the alignment mark portion 142 of FIG. 1. As shown in FIG. 3, the alignment mark portion 142 of the first metal layer 140 defines the first through-hole 1421. The first through-hole 1421 may penetrate or extend through the alignment mark portion 142 from its upper surface to bottom surface. As shown in FIG. 3, the first through-hole 1421 may have a L-shaped profile. However, the present disclosure is not intended to be limited thereto.

Figure 4:
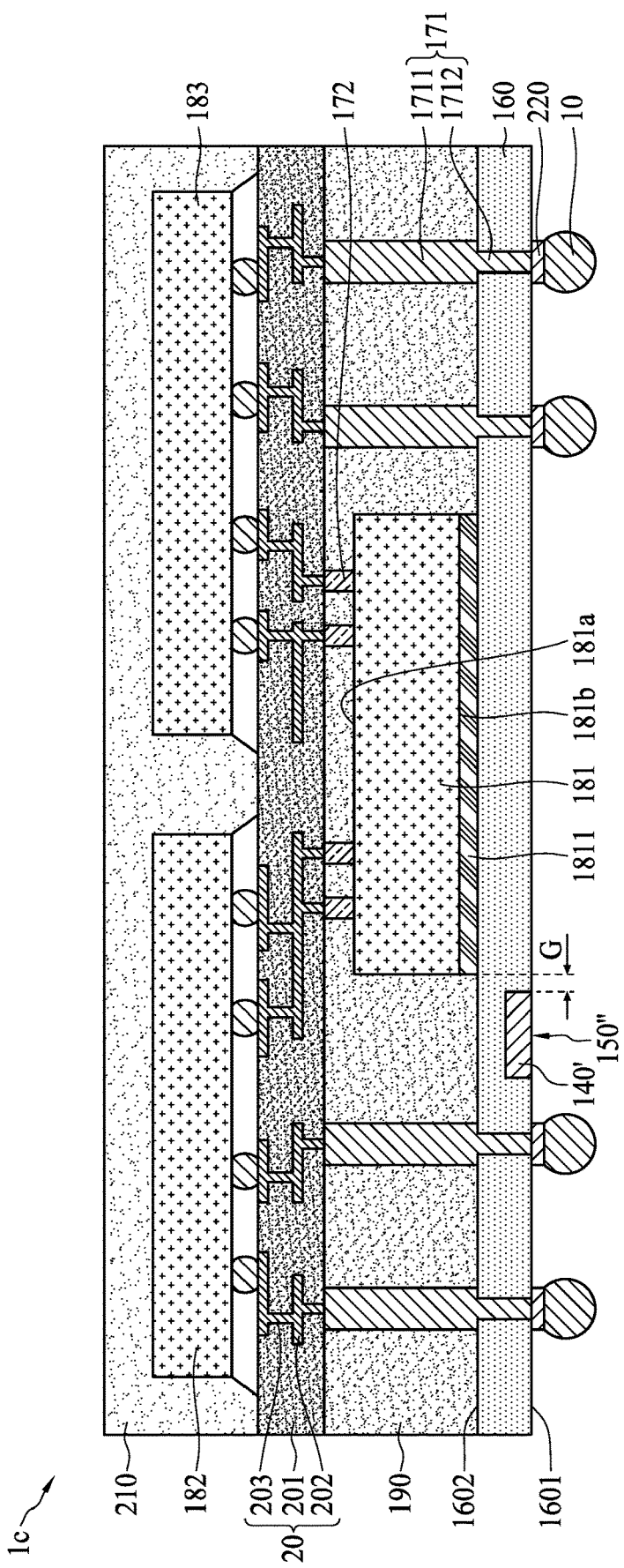
FIG. 4 illustrates a cross-sectional view of an example of a semiconductor package structure according to some embodiments of the present disclosure.

FIG. 4 illustrates a cross-sectional view of an example of a semiconductor package structure 1c according to some embodiments of the present disclosure. The semiconductor package structure 1c of FIG. 4 has a structure similar to that of the semiconductor package structure 1a of FIG. 1 with differences that the semiconductor package structure 1c includes an alignment mark 150" replacing with the alignment mark 150.

In some embodiments, the first metal layer 140' does not have an opening. In some embodiments, the first metal layer 140' may define at least one alignment mark 150". In this embodiment, the alignment mark 150" is defined by the first metal layer 140'. In this embodiment, the entire alignment mark 150" is a solid bulk structure. In this embodiment, the first metal layer 140' may not have a circuit portion. That is, the first metal layer 140' may be dummy, and may have no electrical function. In some embodiments, a horizontal gap G is between the first metal layer 140' and the first semiconductor die 181. In some embodiments, the first metal layer 140' is exposed to air. In some embodiments, the bottom portion 1712 of the conductive pillar 171 penetrates the first passivation layer 160. In some embodiments, the bottom portion 1712 of the conductive pillar 171 is exposed from the first surface 1601 of the first passivation layer 160.

In this embodiment, the first metal layer 140' is embedded in the first passivation layer 160, which can reduce halation. Therefore, the accuracy of bonding semiconductor dies, such as the first semiconductor die 181, is improved. In this embodiment, the alignment portion of the first metal layer 140' is exposed to air.

Figure 5:
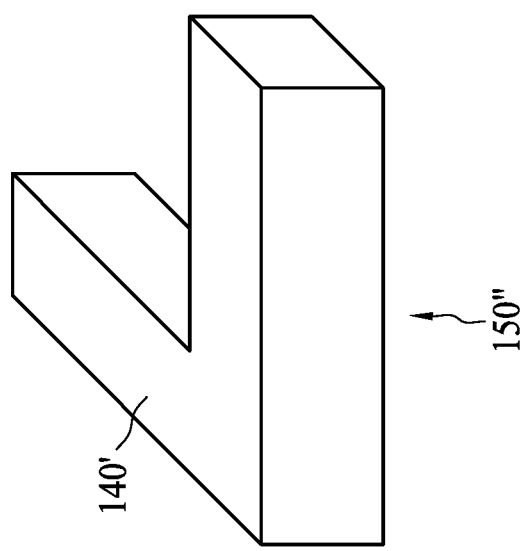
FIG. 5 illustrates a perspective view of an example of an alignment mark of FIG. 4.

FIG. 5 illustrates a perspective view of an example of the alignment mark 150" of FIG. 4. As shown in FIG. 5, the entire alignment mark 150" is a solid bulk structure. For example, the alignment mark 150" may have a L-shaped profile. However, the present disclosure is not intended to be limited thereto.

Figure 6:
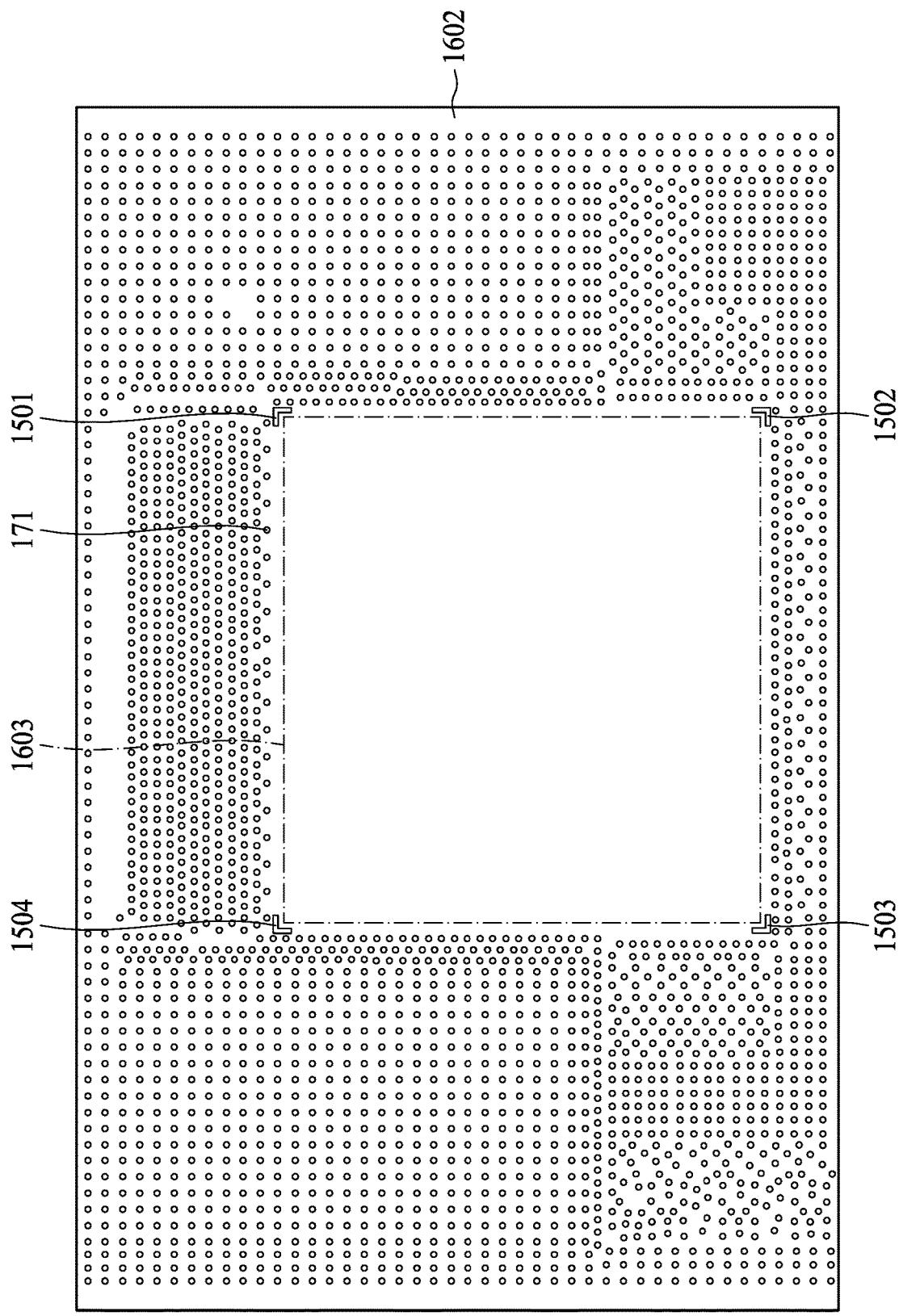
FIG. 6 illustrates a top view of a CCD image from a top view of the conductive pillars and the alignment mark of FIG. 4.

FIG. 6 illustrates a top view of a CCD image from a top view of the conductive pillars 171 and the alignment mark 150" of FIG. 4. The CCD image of FIG. 6 is captured before the first semiconductor die 181 and the encapsulant 190 are disposed on the first passivation layer 160. The CCD image of FIG. 6 may be used for positioning of the first semiconductor die 181 when the first semiconductor die 181 is attached to the first passivation layer 160.

As shown in FIG. 6, the first passivation layer 160 may have a die attaching area 1603, and the alignment mark 150″ of FIG. 4 may include a plurality of alignment marks 1501, 1502, 1503 and 1504. The die attaching area 1603 may be a predetermined imaginary area, and may be the position that the first semiconductor die 181 is attached to the first passivation layer 160. The size of the die attaching area 1603 may be substantially equal to the size of first semiconductor die 181 from a top view. In addition, the alignment marks 1501, 1502, 1503 and 1504 may be disposed adjacent to four corners of the die attaching area 1603. Thus, the alignment marks 1501, 1502, 1503 and 1504 may be disposed between the die attaching area 1603 and the conductive pillars 171. In other embodiments, some of the alignment marks may be omitted. For example, the alignment marks 1501 and 1503 are formed, and the alignment marks 1502 and 1504 are omitted. Each of the alignment marks 1501, 1502, 1503 and 1504 may have a profile different from that of the conductive pillar 171 from a top view. In addition, each of the alignment marks 1501, 1502, 1503 and 1504 may have a profile different from that of conductive metal pads, dummy metal pads and dummy pillars, which are not shown in FIG. 6, from a top view.

Figure 7:
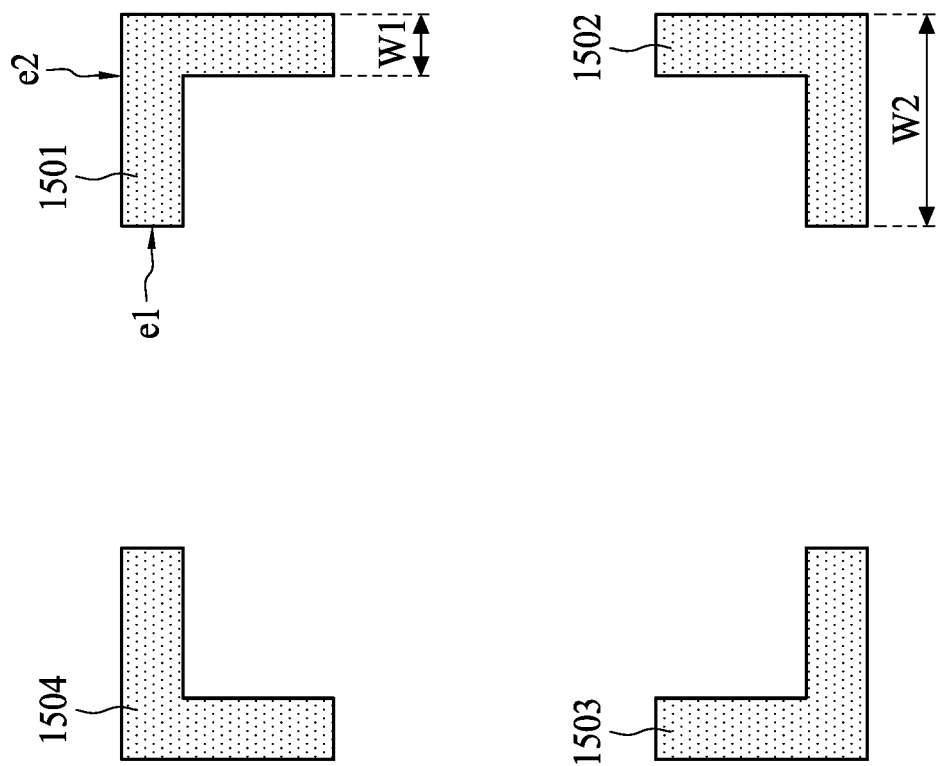
FIG. 7 illustrates a top view of an example of alignment marks shown in FIG. 6.

FIG. 7 illustrates a top view of an example of alignment marks shown in FIG. 6. As shown in FIG. 7, the alignment mark 1501, 1502, 1503 and/or 1504 may have a L-shaped profile. For example, the alignment mark 1501, 1502, 1503 and/or 1504 may have an edge e1 and an edge e2 perpendicular to the edge e1. The edge e1 may have a width W1 ranging from about 30 μm to about 70 μm. The edge e2 may have a width W2 ranging from about 120 μm to about 200 μm.

Figure 8:
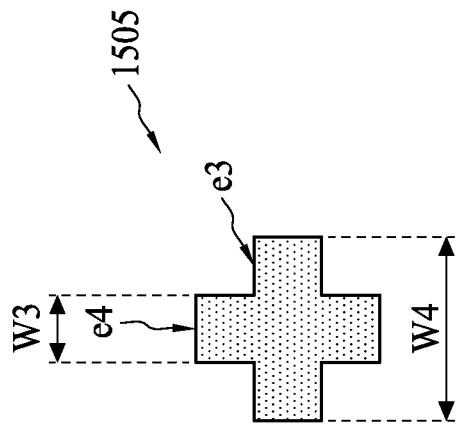
FIG. 8 illustrates a top view of an example of an alignment mark according to some embodiments of the present disclosure.

FIG. 8 illustrates a top view of an example of an alignment mark 1505 according to some embodiments of the present disclosure. As shown in FIG. 8, the alignment mark 1505 may have a cross-shaped profile. The alignment mark 1505 may have an edge e3 protruding from a central region and an edge e4 separated from the central region. The edge e4 may have a width W3 ranging from about 30 μm to about 70 μm. The width W4 of the whole alignment mark 1505, for example, may be a sum of widths of two edges e3 and one edge e4, may range from about 120 μm to about 200 μm.

Figure 9:
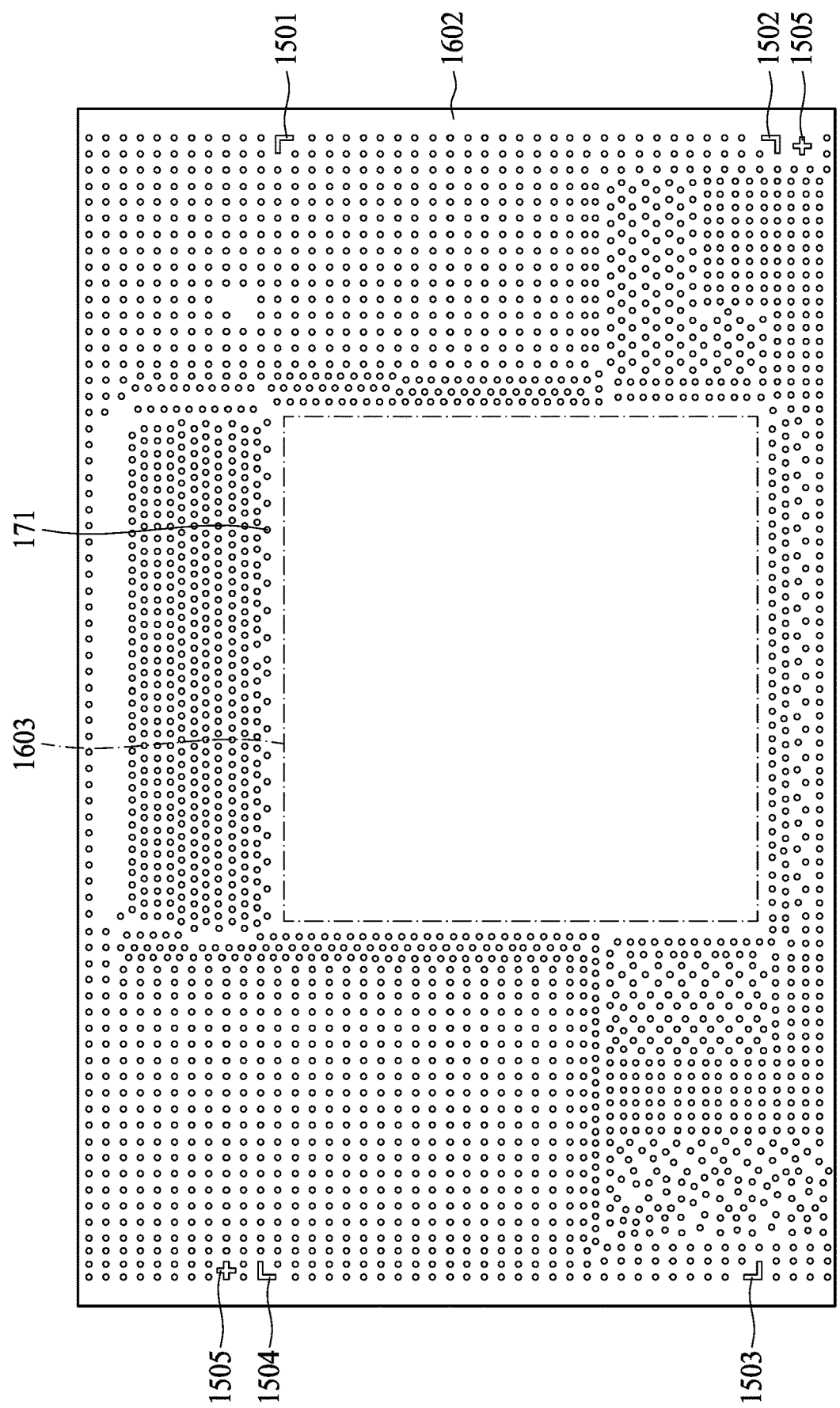
FIG. 9 illustrates a top view of a CCD image from a top view of conductive pillars and alignment mark according to some embodiments of the present disclosure.

FIG. 9 illustrates a top view of a CCD image from a top view of conductive pillars and alignment mark according to some embodiments of the present disclosure. The CCD image of FIG. 9 is similar to the CCD image of FIG. 6, except for the positions of the alignment marks 1501, 1502, 1503 and 1504. As shown in FIG. 9, the alignment marks 1501, 1502, 1503 and 1504 are disposed far away from the die attaching area 1603. For example, the alignment marks 1501, 1502, 1503 and 1504 may be disposed at the outermost row of the conductive pillars 171. In addition, the alignment marks 1505 of FIG. 8 may be further included in FIG. 9.

FIG. 10 through FIG. 22 illustrate a method for manufacturing a semiconductor package structure according to some embodiments of the present disclosure. In some embodiments, the method is for manufacturing a semiconductor package structure, such as the semiconductor package structure 1*a* shown in FIG. 1.

Figure 10:
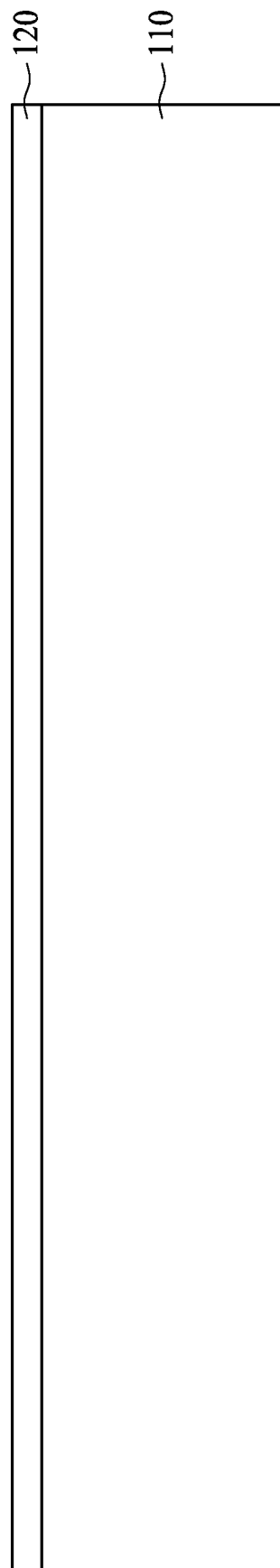
FIG. 10 illustrates one or more stages of an example of a method for manufacturing a semiconductor package structure according to some embodiments of the present disclosure.

Referring to FIG. 10, a carrier 110 is provided. The carrier 110 may be used to assist in forming elements and/or layers thereon and will be removed in subsequent processes. A release layer 120 may be formed on the carrier 110. The release layer 120 may be used to assist in removing the carrier 110 in subsequent processes.

Figure 11:
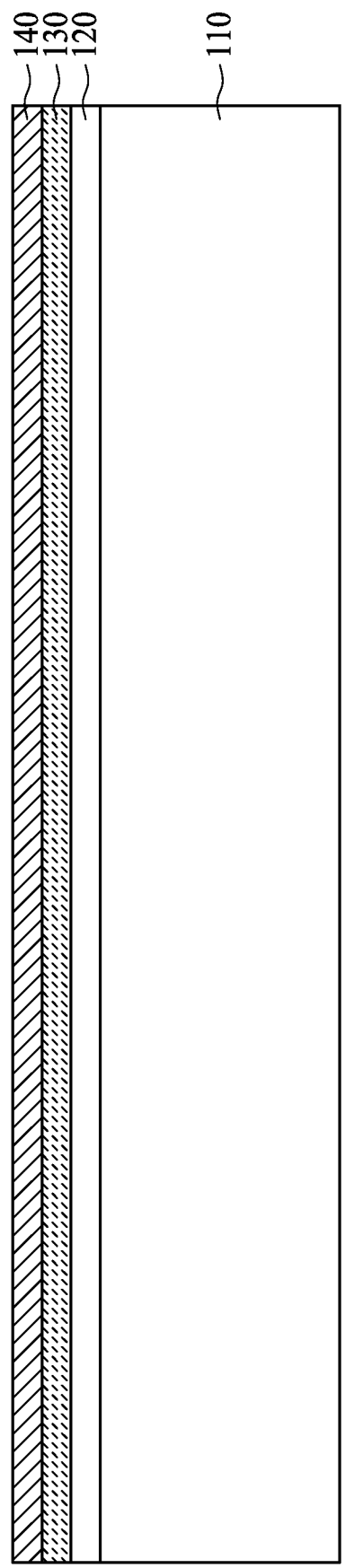
FIG. 11 illustrates one or more stages of an example of a method for manufacturing a semiconductor package structure according to some embodiments of the present disclosure.

Referring to FIG. 11, a seed layer 130 may be formed on the release layer 120. In some embodiments, the seed layer 130 may include, for example, titanium or other suitable materials. Then, a first metal layer 140 is formed on the seed layer 130. The first metal layer 140 may be formed by, for example, an electroplating process or other suitable process. In some embodiments, the first metal layer 140 is copper, and the seed layer 130 is titanium.

Figure 12:
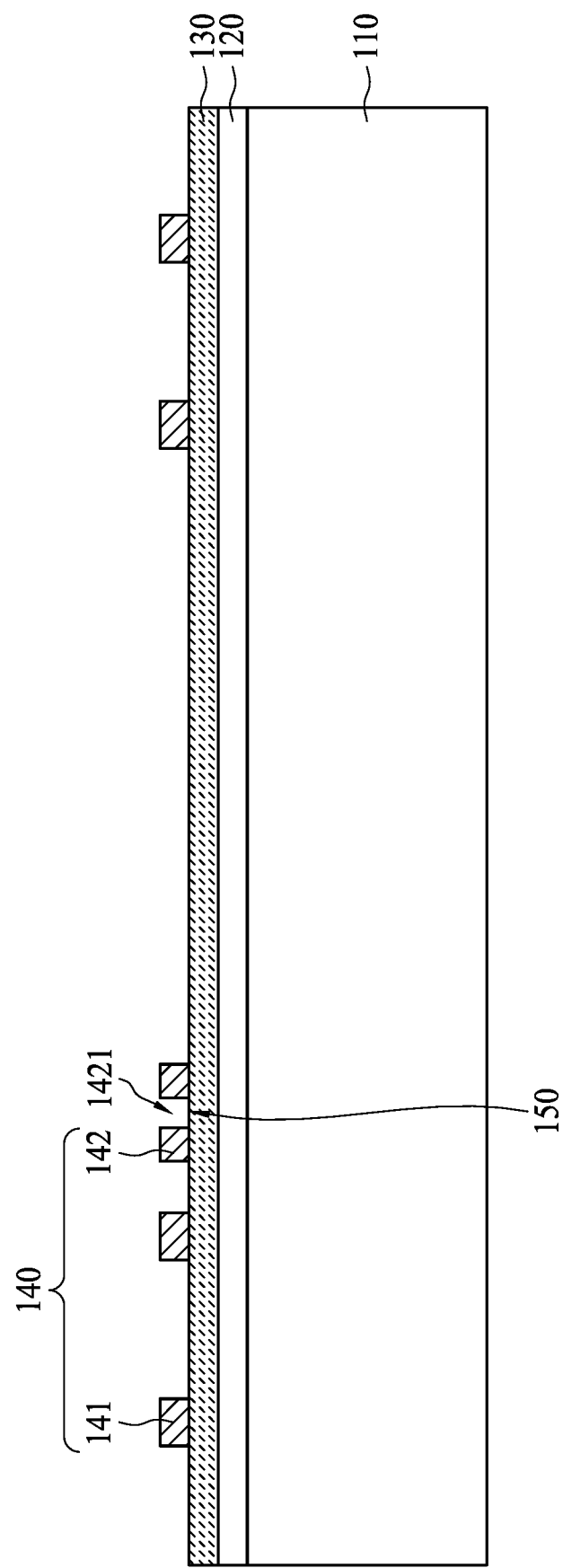
FIG. 12 illustrates one or more stages of an example of a method for manufacturing a semiconductor package structure according to some embodiments of the present disclosure.

Referring to FIG. 12, the first metal layer 140 is patterned to form a circuit portion 141 and an alignment mark portion 142. The alignment mark portion 142 may define a first through-hole 1421. The first through-hole 1421 may serve an alignment mark 150 in subsequent processes. In some embodiments, the first through-hole 1421 may extend through the alignment mark portion 142 to expose the seed layer 130. The first metal layer 140 may be patterned by one or more etching and/or lithography processes. For example, the first metal layer 140 may be etched by an anisotropic etching process.

Figure 13:
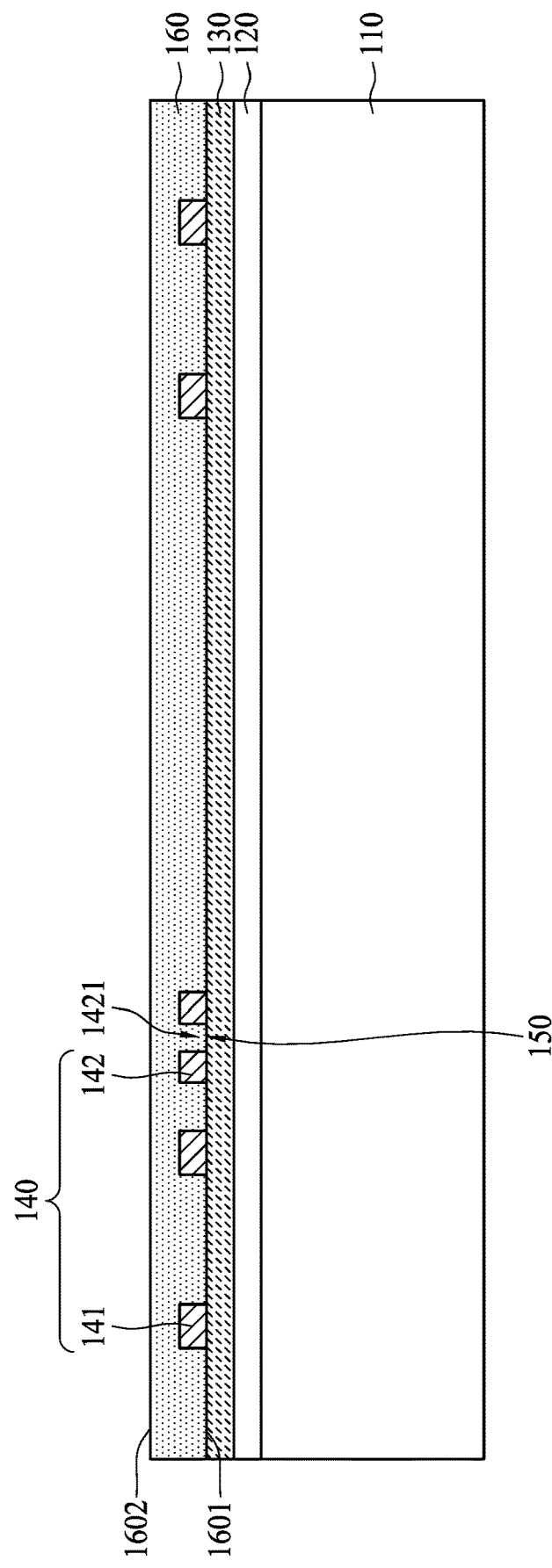
FIG. 13 illustrates one or more stages of an example of a method for manufacturing a semiconductor package structure according to some embodiments of the present disclosure.

Referring to FIG. 13, a first passivation layer 160 is formed on the seed layer 130. The first passivation layer 160 covers the circuit portion 141 and the alignment mark portion 142. The first passivation layer 160 fills into the first through-hole 1421. A first surface 1601 of the first passivation layer 160 may be adjacent to the seed layer 130. A second surface 1602 of the first passivation layer 160 may be far from the seed layer 130. The first passivation layer 160 may be formed by, for example, a coating process or other suitable process.

Figure 14:
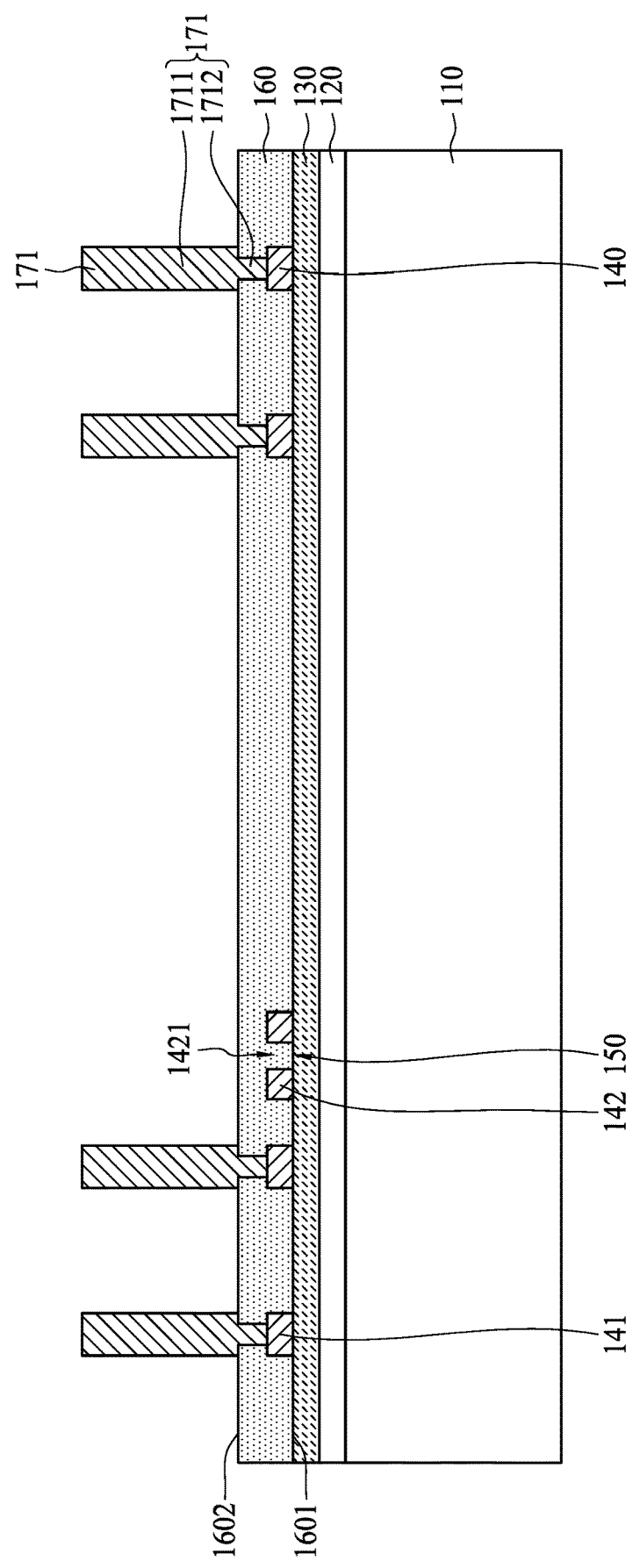
FIG. 14 illustrates one or more stages of an example of a method for manufacturing a semiconductor package structure according to some embodiments of the present disclosure.

Referring to FIG. 14, a plurality of conductive pillars 171 are formed. In some embodiments, an etching process may be performed to form a plurality of openings on the first passivation layer 160. The openings may expose the circuit portion 141. The openings do not expose the alignment mark portion 142. Next, a seed layer (not shown) may be formed on the top surface of the circuit portion 141 of the first metal layer 140, and an electroplating process may be performed to form the conductive pillars 171. Each of the conductive pillars 171 may include a bottom portion 1712 filling the opening of the passivation layer 160 and a main portion 1711 extending upward from the bottom portion 1712.

Figure 15:
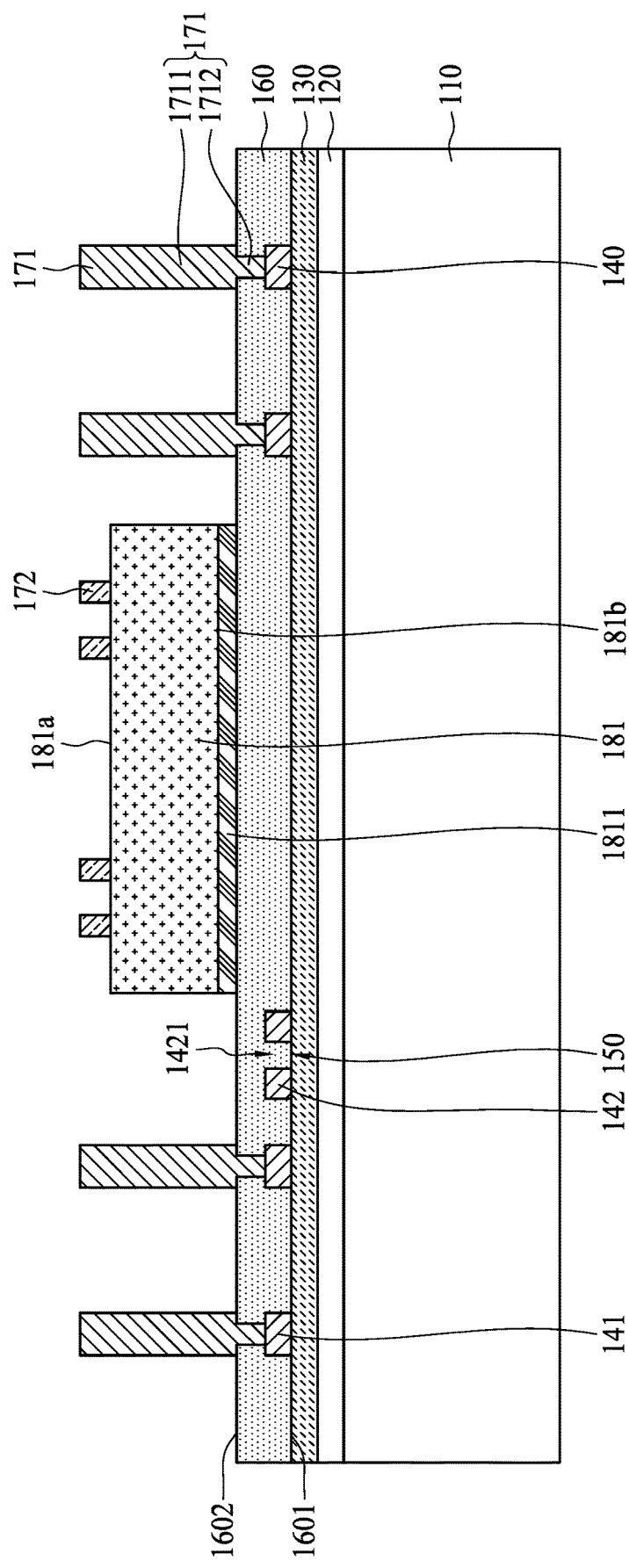
FIG. 15 illustrates one or more stages of an example of a method for manufacturing a semiconductor package structure according to some embodiments of the present disclosure.

Referring to FIG. 15, a first semiconductor die 181 including a plurality of conductive bumps 172 are formed on the first passivation layer 160 through an adhesion layer 1811. The first semiconductor die 181 may be bonded on the second surface 1602 of the first passivation layer 160 by a die attach process. In some embodiments, the conductive bumps 172 may be formed on the first semiconductor die 181 before the first semiconductor die 181 is bonded to the first passivation layer 160. In some embodiments, a first aligning process may be performed during bonding the first semiconductor die 181 on the first passivation layer 160. Since the first passivation layer 160 is substantially transparent, the portion of the seed layer 130, exposed from the first through-hole 1421, is visible in a CCD image. In some embodiments, the metal layer 140 is made of copper, and the seed layer 130 is made of titanium, having a different color from the metal layer 140, so that CCD can identify the metal layer 140 and the seed layer 130. That is, the first through-hole 1421, which has a profile different from the conductive pillars 171, can be detected by CCD, as shown in FIG. 6 and FIG. 9. That is, the alignment mark portion 142 of the first metal layer 140 can be used as an alignment mark (e.g., the alignment mark 150). In this embodiment, the alignment mark 150 in a CCD image may be much clear because halation is reduced. Therefore, the first semiconductor die 181 may be bonded to the die attaching area 1603 of the first passivation layer 160 precisely, and the accuracy of bonding the first semiconductor die 181 on the first passivation layer 160 is increased.

Figure 16:
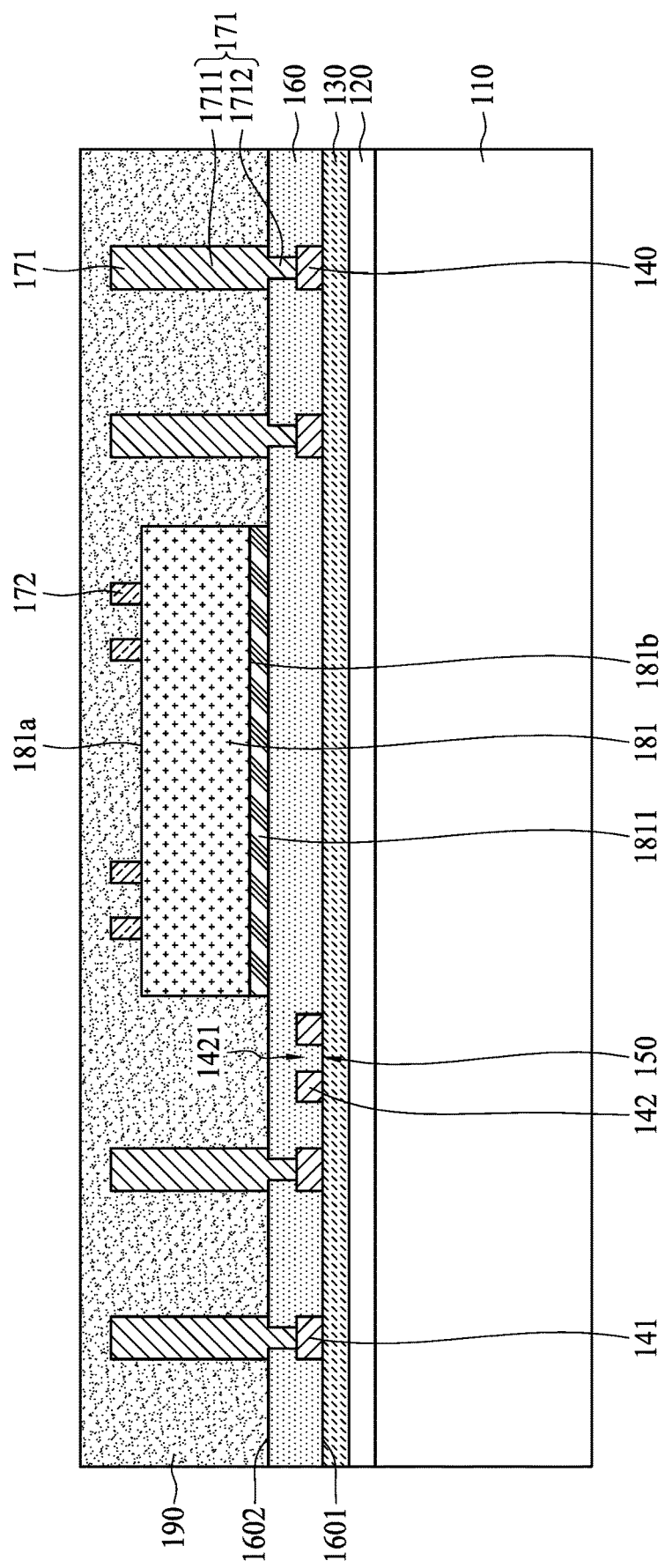
FIG. 16 illustrates one or more stages of an example of a method for manufacturing a semiconductor package structure according to some embodiments of the present disclosure.

Referring to FIG. 16, an encapsulant 190 is formed to cover the first semiconductor die 181. In addition, the encapsulant 190 covers the top surfaces of the conductive pillars 171 and the top surfaces of the conductive bumps 172.

Figure 17:
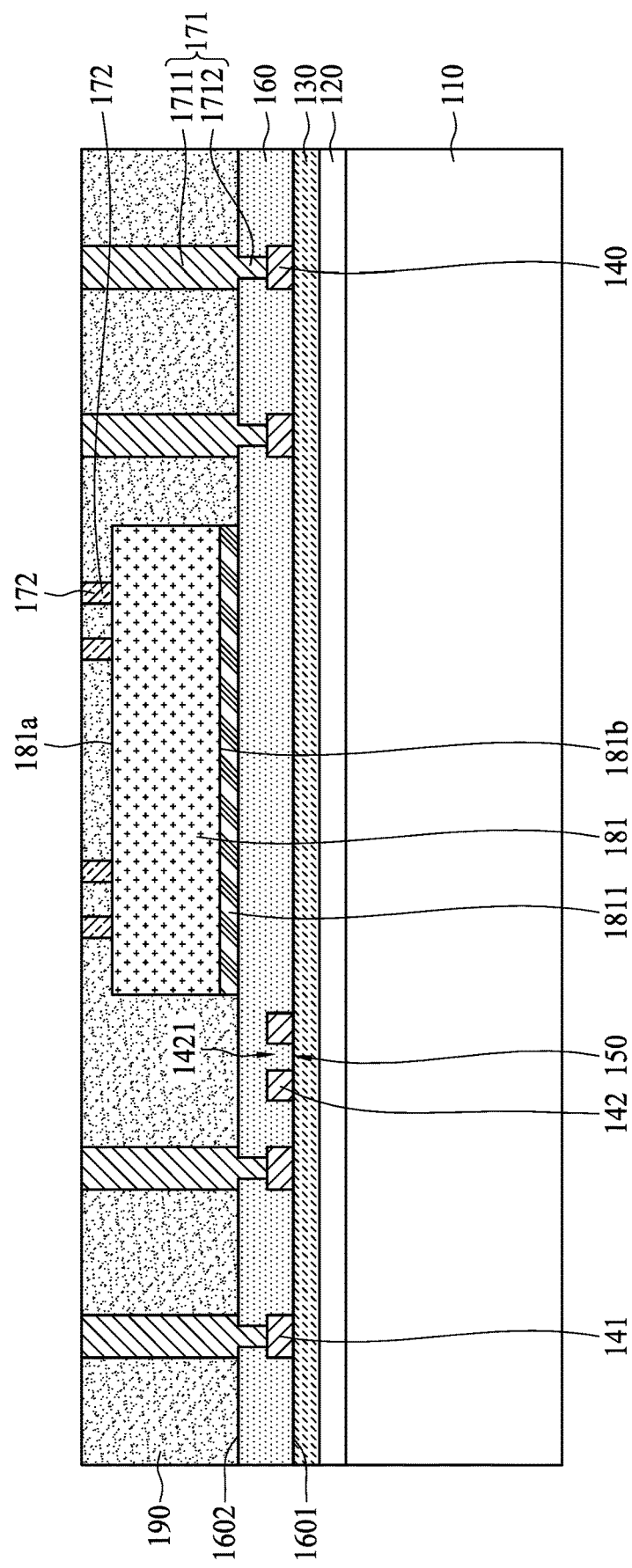
FIG. 17 illustrates one or more stages of an example of a method for manufacturing a semiconductor package structure according to some embodiments of the present disclosure.

Referring to FIG. 17, a grinding process may be performed on the encapsulant 190 such that the top surfaces of the conductive pillars 171 and the top surfaces of the conductive bumps 172 are exposed from the encapsulant 190. After the grinding process is performed, the top surface of the encapsulant 190, the top surfaces of the conductive bumps 172 and the top surfaces of the conductive pillars 171 are substantially coplanar with other.

Figure 18:
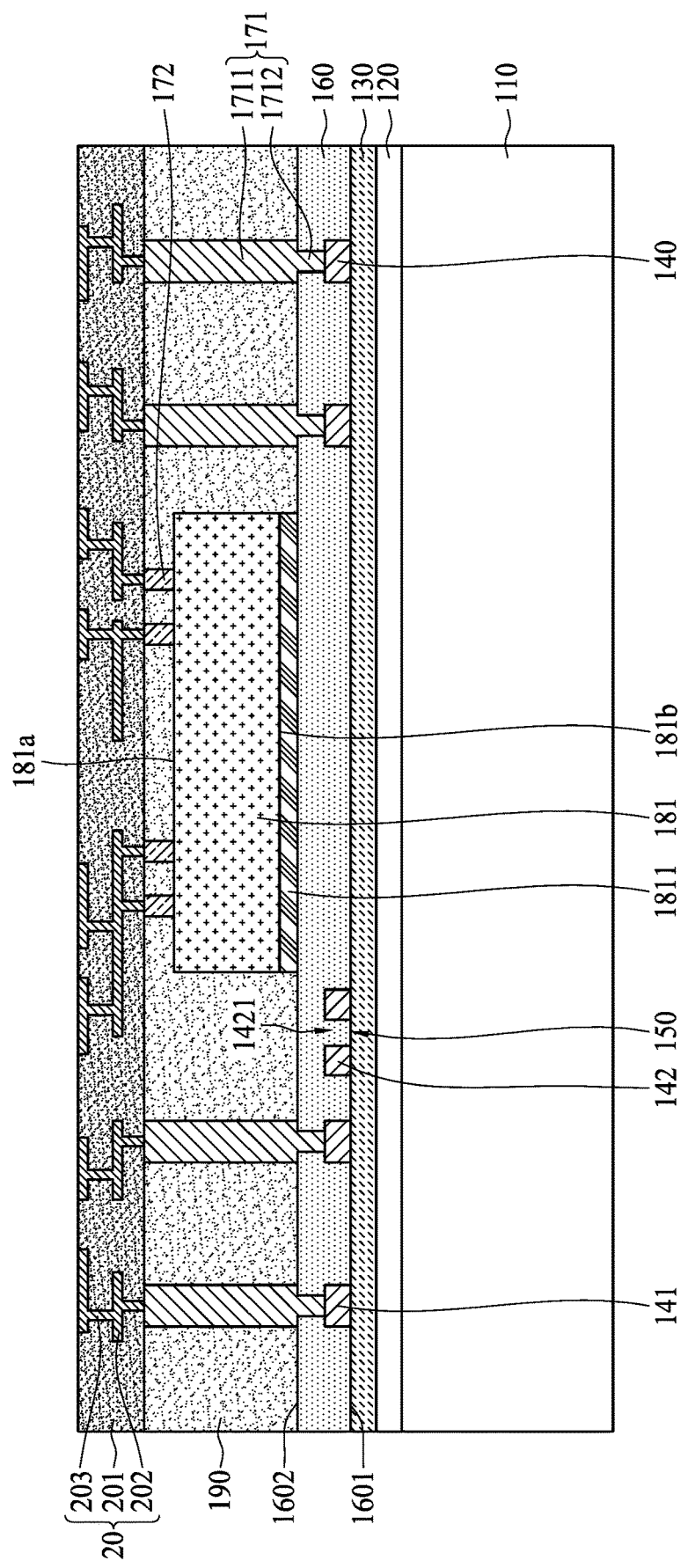
FIG. 18 illustrates one or more stages of an example of a method for manufacturing a semiconductor package structure according to some embodiments of the present disclosure.

Referring to FIG. 18, a redistribution structure 20 is formed on the encapsulant 190. In some embodiments, the dielectric structure 201 may include two or more dielectric layers formed at different steps. In some embodiments, two or more redistribution layers 202 may be formed at different steps. In some embodiments, two or more vias 203 may be formed at different steps. For example, a first dielectric layer may be formed on the encapsulant 190, and then the first dielectric layer is patterned to form a plurality of openings. Next, a first conductive material is deposited to fill the openings and cover the first dielectric layer, and then the first conductive material is patterned such that the first via and the first redistribution layer is formed. These steps can be repeated to form dielectric structure 201 with multiple redistribution layers 202 and the vias 203 formed therein.

Figure 19:
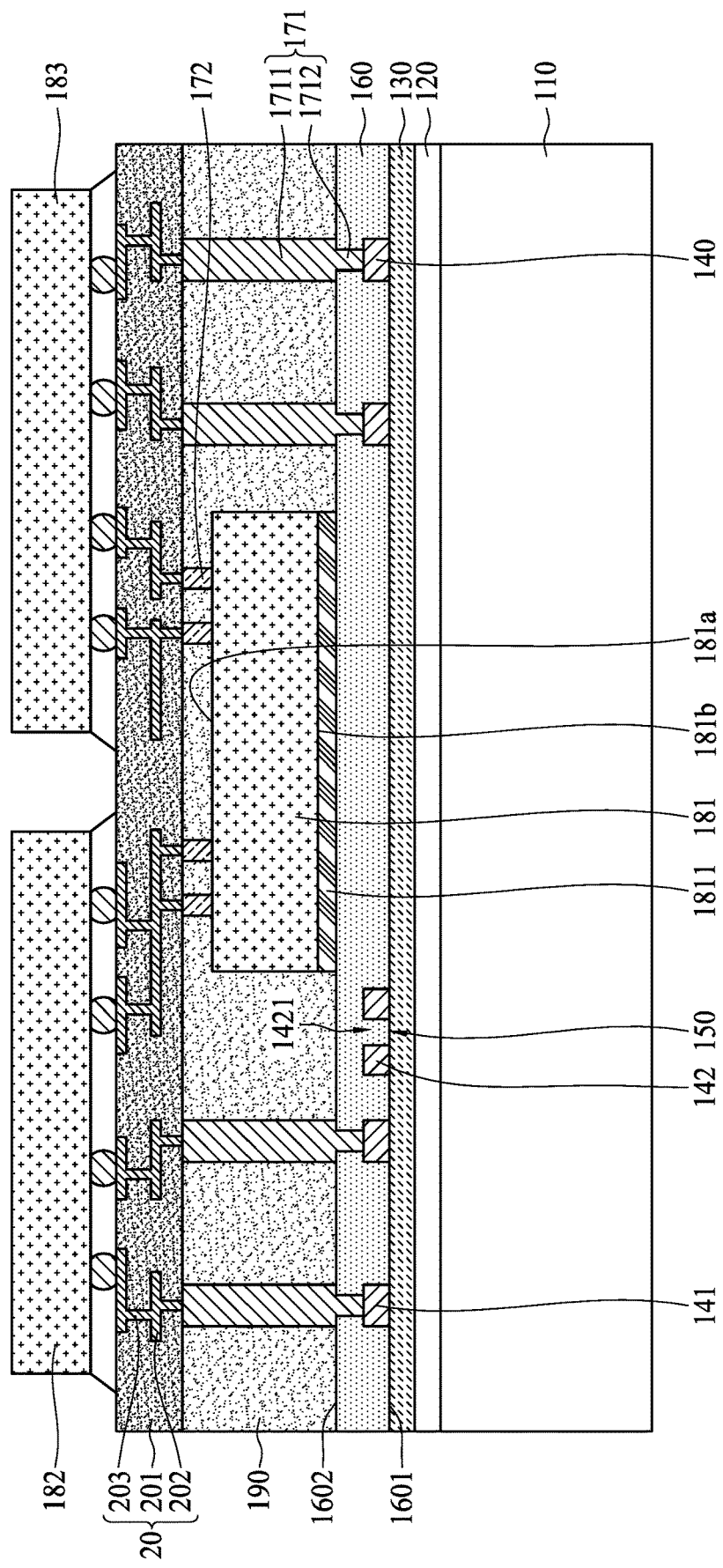
FIG. 19 illustrates one or more stages of an example of a method for manufacturing a semiconductor package structure according to some embodiments of the present disclosure.

Referring to FIG. 19, a second semiconductor die 182 and a third semiconductor die 183 are bonded to and electrically connected to the redistribution structure 20. Each of the second semiconductor die 182 and the third semiconductor die 183 may include a plurality of bumps. The bumps of the second semiconductor die 182 and the third semiconductor die 183 may be attached to the redistribution structure 20 so that the bumps of the second semiconductor die 182 and the third semiconductor die 183 may be in contact with the redistribution layers 202 of the redistribution structure 20. Moreover, an underfill material, for example, made of epoxy, may be formed to cover and protect the bumps of the second semiconductor die 182 and the third semiconductor die 183.

Figure 20:
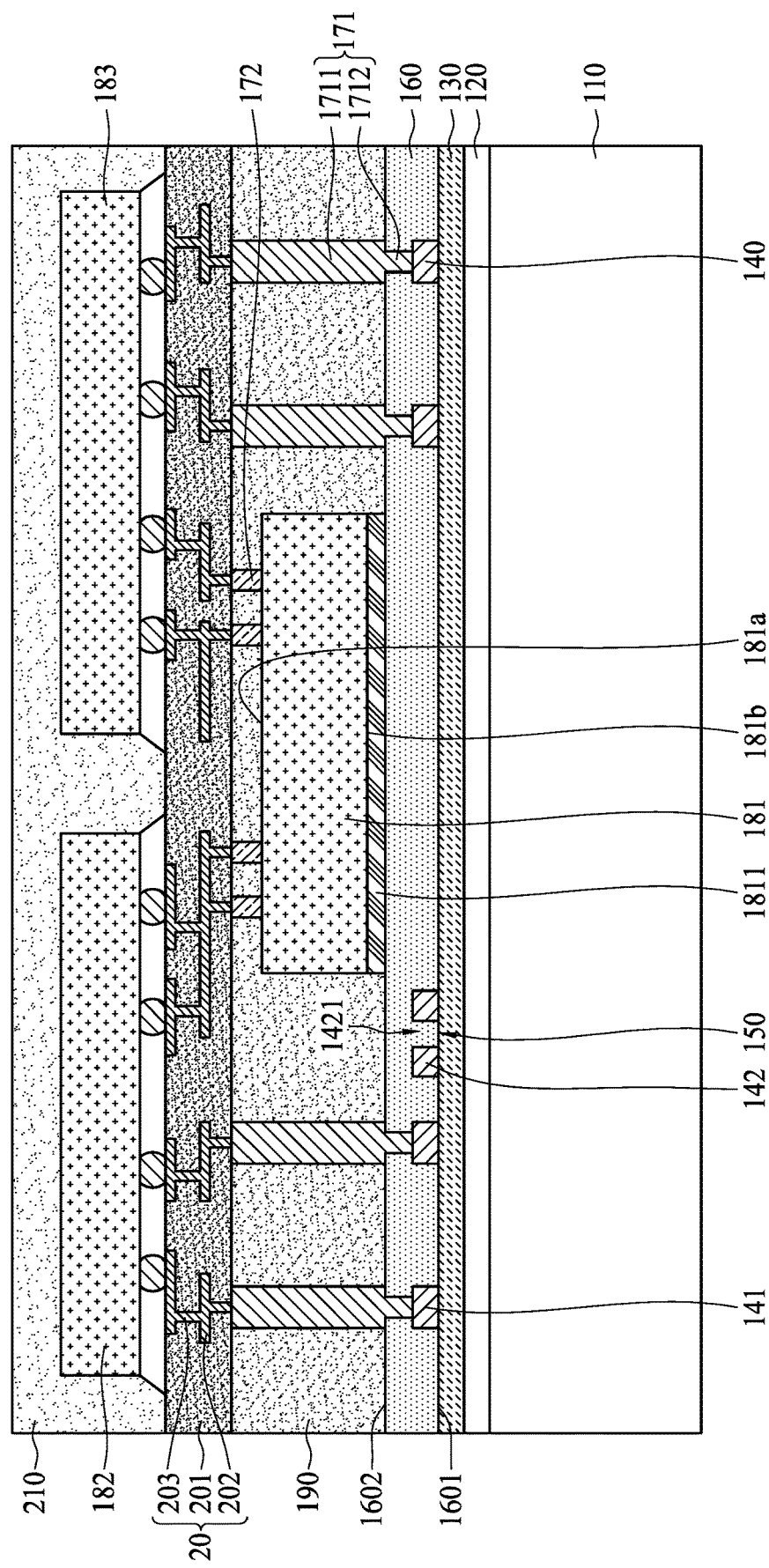
FIG. 20 illustrates one or more stages of an example of a method for manufacturing a semiconductor package structure according to some embodiments of the present disclosure.

Referring to FIG. 20, a protection layer 210 is formed to cover the second semiconductor die 182, the third semiconductor die 183 and the underfill material.

Figure 21:
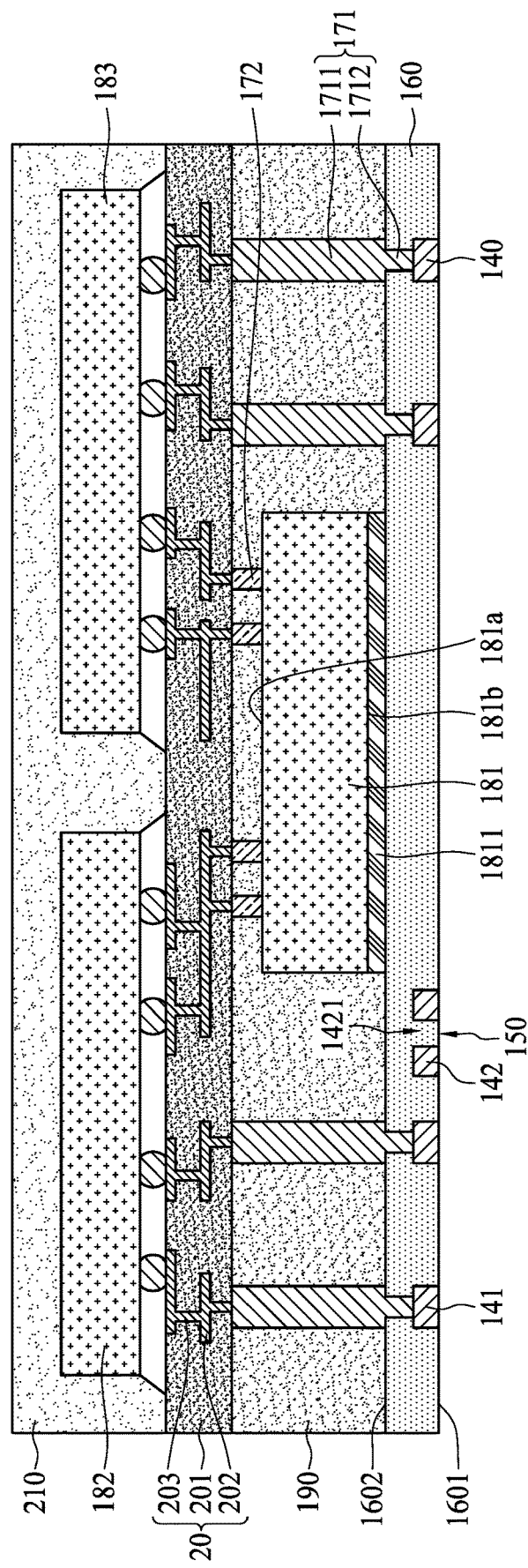
FIG. 21 illustrates one or more stages of an example of a method for manufacturing a semiconductor package structure according to some embodiments of the present disclosure.

Referring to FIG. 21, the carrier 110, the release layer 120 and the seed layer 130 are removed. At this stage, the bottom surfaces of the circuit portion 141 and/or the alignment mark portion 142 are exposed from the first surface 1601 of the first passivation layer 160.

Figure 22:
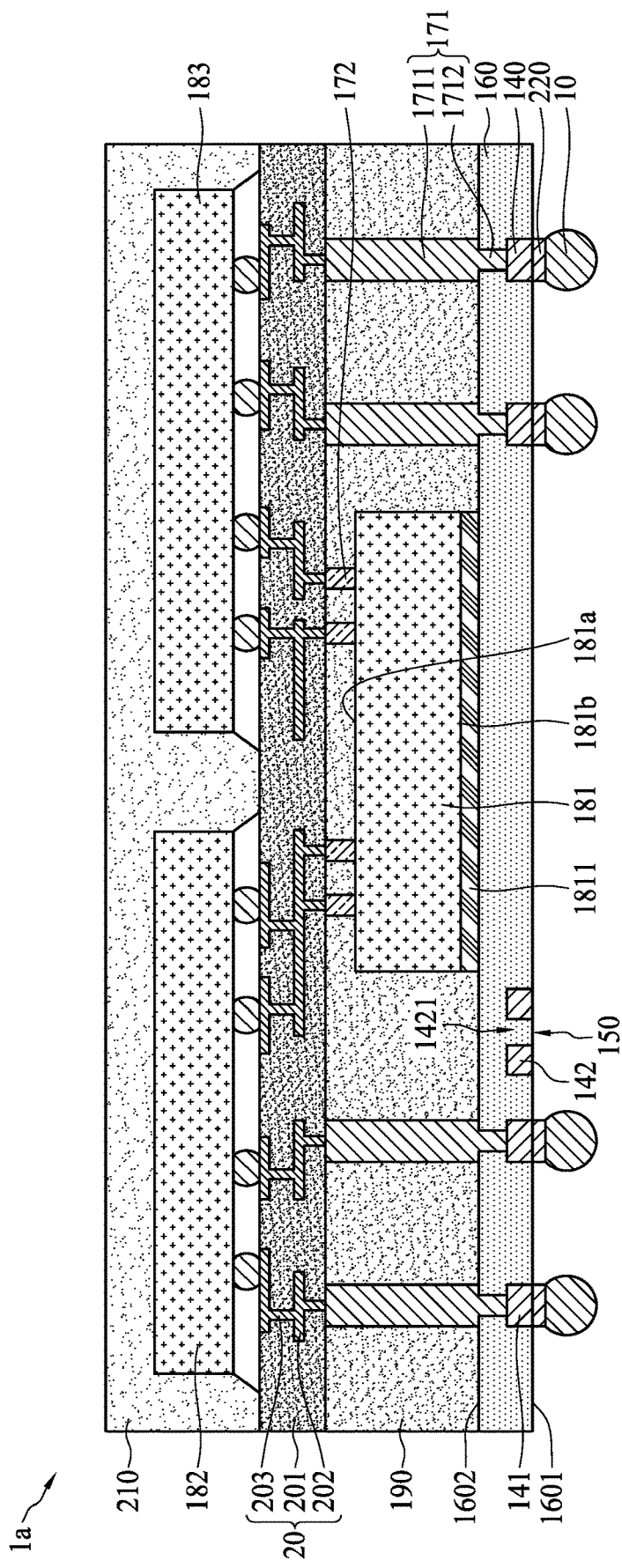
FIG. 22 illustrates one or more stages of an example of a method for manufacturing a semiconductor package structure according to some embodiments of the present disclosure.

Referring to FIG. 22, a plurality of bonding pads 220 and a plurality of conductive terminals 10 are formed to produce the semiconductor package structure 1a. The bonding pad 220 may be formed on the circuit portion 141 of the first metal layer 140. The conductive terminal 10 may be formed on the bonding pad 220. The bonding pad 220 and the conductive terminal 10 do not cover the alignment mark portion 142. In some embodiments, the conductive terminals 10 are formed by a ball drop process. An alignment mark may be required during performing a ball drop process. In some embodiments, the alignment mark portion 142 of the first metal layer 140 is exposed from the first surface 1601 of the first passivation layer 160. Therefore, the alignment mark portion 142 is visible in a CCD image captured from the first surface 1601 of the first passivation layer 160. In some embodiments, a second aligning process is performed to form the conductive terminals 10 on the first passivation layer 160 by using the first through-hole 1421 as the alignment mark 150.

According to some embodiments of the disclosure, the first metal layer 140 includes an alignment mark portion 142 defining a first through-hole 1421, which can serve as an alignment mark. In some embodiments, the first through-hole 1421 is used as an alignment mark at a step of bonding the first semiconductor die 181. In some embodiments, the first through-hole 1421 is used as an alignment mark (e.g., the alignment mark 150) at a step of forming the conductive terminal 10. In some embodiments, the first metal layer 140 is embedded in the first passivation layer 160, reducing halation. Therefore, the yield of bonding the first semiconductor die 181 is increased. In some embodiments, the alignment mark portion 142 is exposed to air. Therefore, the first through-hole 1421, defined by alignment mark portion 142, can be used as an alignment mark 150 to perform a ball drop process forming the conductive terminal 10. The plating process, involved in warpage problems, can be replaced with the ball drop process. As a result, the process window of forming the semiconductor package structure 1a is improved.

Figure 23:
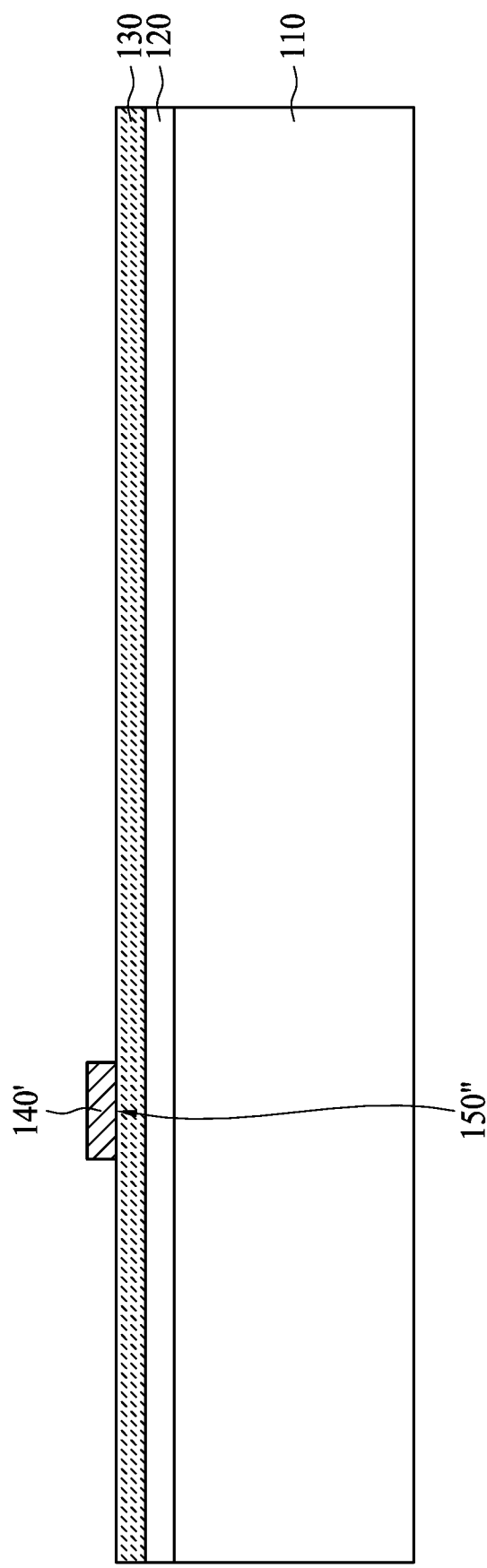
FIG. 23 illustrates one or more stages of an example of a method for manufacturing a semiconductor package structure according to some embodiments of the present disclosure.
Figure 24:
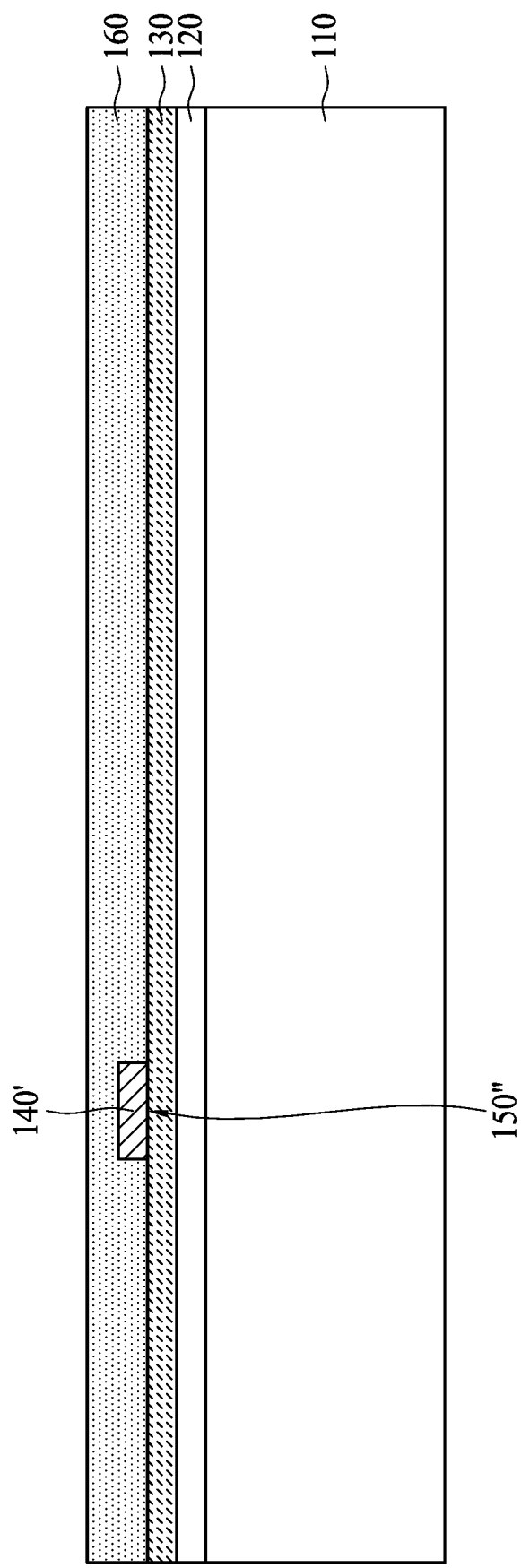
FIG. 24 illustrates one or more stages of an example of a method for manufacturing a semiconductor package structure according to some embodiments of the present disclosure.
Figure 25:
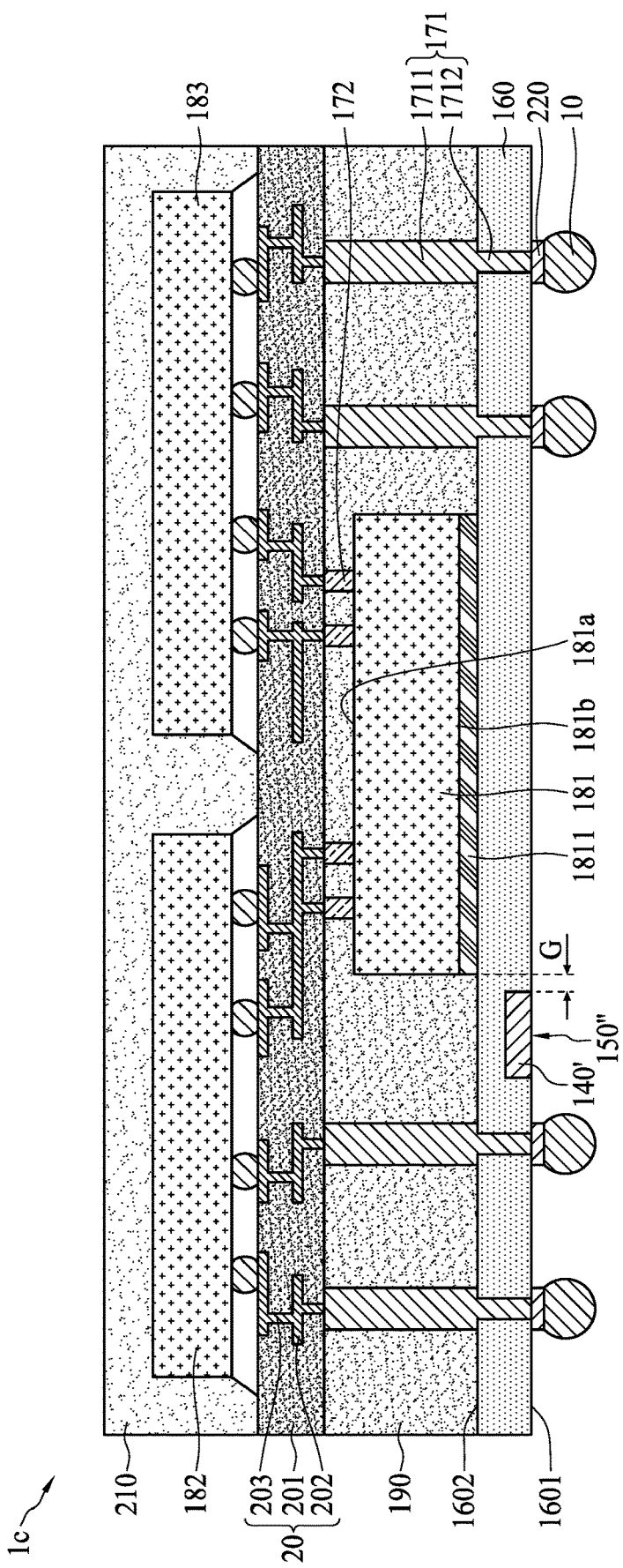
FIG. 25 illustrates one or more stages of an example of a method for manufacturing a semiconductor package structure according to some embodiments of the present disclosure.

FIG. 23 through FIG. 25 illustrate a method for manufacturing a semiconductor package structure according to some embodiments of the present disclosure. In some embodiments, the method is for manufacturing a semiconductor package structure, such as the semiconductor package structure 1c shown in FIG. 4. The initial stage of the illustrated process is the same as, or similar to, the stage illustrated in FIG. 10 through FIG. 11. FIG. 23 depicts a stage subsequent to that depicted in FIG. 11.

Referring to FIG. 23, the first metal layer 140' is formed. In some embodiments, the first metal layer 140' may be formed on the seed layer 130. In this embodiment, the first metal layer 140' can serve as an alignment mark 150". In this embodiment, the alignment mark 150" is not defined by an opening of the first metal layer 140'. In this embodiment, the alignment mark 150" is defined by a solid bulk structure of the first metal layer 140'.

Referring to FIG. 24, a first passivation layer 160 is formed on the seed layer 130. The first passivation layer 160 covers the first metal layer 140'.

Referring to FIG. 25, the first semiconductor die 181, the second semiconductor die 182, the third semiconductor die 183, the conductive pillars 171, the conductive bumps 172, the redistribution structure 20, the protection layer 210, the bonding pads 220 and the conductive terminal 10 are formed. Then, the carrier 110, the release layer 120 and the seed layer 130 are removed to produce the semiconductor package structure 1c. The stages from FIG. 24 to FIG. 25 may be the same as or similar to those from FIG. 14 to FIG. 22.

In this embodiment, the alignment mark 150" can be used at a step of bonding the first semiconductor die 181. In this embodiment, the alignment mark 150" can be also used at a step of forming the conductive terminal 10.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package structure, comprising:
   a first passivation layer;
   a semiconductor die disposed over the first passivation layer;
   a first patterned layer disposed within the first passivation layer, wherein a portion of the first patterned layer is configured to serve as an alignment mark during a disposing process of the semiconductor die;
   an encapsulant continuously encapsulating a lateral surface and a top surface of the semiconductor die; and
   a plurality of pillars extending through the encapsulant, wherein the portion is closer to the semiconductor die than each of the plurality of pillars is.

2. The semiconductor package structure of claim 1, wherein a first one of the plurality of pillars and a second one of the plurality of pillars are disposed adjacent to a lateral side of semiconductor die, and a gap between the first one of the plurality of pillars and the second one of the plurality of pillars is greater than a horizontal gap between the portion and the semiconductor die.

3. The semiconductor package structure of claim 1, wherein a horizontal gap between the portion and the semiconductor die is less than a horizontal gap between the portion and a first one of the plurality of pillars that is most adjacent to the portion than the others of the plurality of pillars.

4. A semiconductor package structure, comprising:
   a first passivation layer;
   a semiconductor die disposed over the first passivation layer;
   a first patterned layer disposed within the first passivation layer, wherein a portion of the first patterned layer is configured to serve as an alignment mark during a disposing process of the semiconductor die; and
   an encapsulant continuously encapsulating a lateral surface and a top surface of the semiconductor die,
   wherein a bottom surface of the portion is exposed to air and is substantially aligned with a bottom surface of the first passivation layer.

5. A semiconductor package structure, comprising:
   a first passivation layer;
   a semiconductor die disposed over the first passivation layer;
   a first patterned layer disposed within the first passivation layer, wherein a portion of the first patterned layer is configured to serve as an alignment mark during a disposing process of the semiconductor die;
   an encapsulant continuously encapsulating a lateral surface and a top surface of the semiconductor die; and
   a plurality of solder balls disposed under the first passivation layer, wherein a horizontal gap between the portion and a first one of the solder ball, that is most adjacent to the portion than the others of the plurality of solder balls, is greater than a horizontal gap between the portion and the semiconductor die.

6. A semiconductor package structure, comprising:
a first passivation layer;
a semiconductor die disposed over the first passivation layer;
a first patterned layer disposed within the first passivation layer, wherein a portion of the first patterned layer is configured to serve as an alignment mark during a disposing process of the semiconductor die; and
an encapsulant continuously encapsulating a lateral surface and a top surface of the semiconductor die,
wherein the alignment mark is defined by a first through-hole within the portion, wherein a portion of the first passivation layer is disposed in the first through-hole and is exposed to air.

7. The semiconductor package structure of claim 6, wherein a bottom surface of the portion of the first patterned layer and a bottom surface of the portion of the first passivation layer are substantially aligned with each other and are exposed to air.

8. A semiconductor package structure, comprising:
a first passivation layer;
a semiconductor die disposed over the first passivation layer;
a first patterned layer disposed within the first passivation layer, wherein a portion of the first patterned layer is configured to serve as an alignment mark during a disposing process of the semiconductor die; and
an encapsulant continuously encapsulating a lateral surface and a top surface of the semiconductor die,
wherein a first part of the portion extends along a first side of the semiconductor die, and a second part of the portion extends along a second side of the semiconductor die from a top view perspective.

9. A semiconductor package structure, comprising:
a first passivation layer;
a semiconductor die disposed over the first passivation layer;
a first patterned layer disposed within the first passivation layer, wherein a portion of the first patterned layer is configured to serve as an alignment mark during a disposing process of the semiconductor die;
an encapsulant continuously encapsulating a lateral surface and a top surface of the semiconductor die,
a second passivation layer disposed under the first passivation layer; and
a second patterned layer disposed within the second passivation layer, wherein a portion of the second patterned layer is configured to serve as an alignment mark during the disposing process of the semiconductor die.

10. The semiconductor package structure of claim 9, wherein a lateral surface of the portion of the second patterned layer is substantially aligned with a lateral surface of the portion of the first patterned layer.

11. A semiconductor package structure, comprising:
a passivation layer;
a first semiconductor die disposed over the passivation layer;
a first metal layer disposed within the passivation layer, wherein a portion of the first metal layer is configured to serve as an alignment mark during a disposing process of the first semiconductor die;
a redistribution structure disposed over the first semiconductor die;
a second semiconductor die disposed over the redistribution structure, and electrically connected to the first semiconductor die through the redistribution structure; and
a third semiconductor die disposed over the redistribution structure, and electrically connected to the first semiconductor die through the redistribution structure,
wherein the second semiconductor die is electrically connected to the third semiconductor die through the first semiconductor die.

12. A semiconductor package structure, comprising:
a passivation layer;
a first semiconductor die disposed over the passivation layer;
a first metal layer disposed within the passivation layer, wherein a portion of the first metal layer is configured to serve as an alignment mark during a disposing process of the first semiconductor die;
a redistribution structure disposed over the first semiconductor die;
a second semiconductor die disposed over the redistribution structure, and electrically connected to the first semiconductor die through the redistribution structure;
a third semiconductor die disposed over the redistribution structure, and electrically connected to the first semiconductor die through the redistribution structure;
a first underfill connecting the second semiconductor die and the redistribution structure, and having a lateral surface extending from a lateral surface of the second semiconductor die to a top surface of the redistribution structure and inclined toward the third semiconductor die; and
a second underfill connecting the third semiconductor die and the redistribution structure, and having a lateral surface extending from a lateral surface of the third semiconductor die to the top surface of the redistribution structure and inclined toward the second semiconductor die.

13. The semiconductor package structure of claim 12, further comprising:
an encapsulant disposed between the second semiconductor die and the third semiconductor die, and contacting the lateral surface of the first underfill and the lateral surface of the second underfill.

14. A semiconductor package structure, comprising:
a passivation layer;
a first semiconductor die disposed over the passivation layer;
a first metal layer disposed within the passivation layer, wherein a portion of the first metal layer is configured to serve as an alignment mark during a disposing process of the first semiconductor die;
a redistribution structure disposed over the first semiconductor die;
a second semiconductor die disposed over the redistribution structure, and electrically connected to the first semiconductor die through the redistribution structure;
a third semiconductor die disposed over the redistribution structure, and electrically connected to the first semiconductor die through the redistribution structure; and
an encapsulant encapsulating at least two lateral surfaces of the second semiconductor die and at least two lateral surfaces of the third semiconductor die,
wherein the encapsulant encapsulates a top surface of the second semiconductor die and a top surface of the third semiconductor die.

15. A semiconductor package structure, comprising:
a passivation layer;
a first semiconductor die disposed over the passivation layer;
a first metal layer disposed within the passivation layer, wherein a portion of the first metal layer is configured to serve as an alignment mark during a disposing process of the first semiconductor die;
a redistribution structure disposed over the first semiconductor die;
a second semiconductor die disposed over the redistribution structure, and electrically connected to the first semiconductor die through the redistribution structure;
a third semiconductor die disposed over the redistribution structure, and electrically connected to the first semiconductor die through the redistribution structure; and
a plurality of first pillars connecting to the redistribution structure and the first metal layer, wherein, in a cross-sectional view, the plurality of first pillars are vertically overlapped with the second semiconductor die.

16. The semiconductor package structure of claim 15, further comprising:
a plurality of second pillars connecting to the redistribution structure and the first metal layer, wherein, in the cross-sectional view, the plurality of second pillars are vertically overlapped with the third semiconductor die.

17. A semiconductor package structure, comprising:
a passivation layer;
a first semiconductor die disposed over the passivation layer;
a first metal layer disposed within the passivation layer, wherein a portion of the first metal layer is configured to serve as an alignment mark during a disposing process of the first semiconductor die;
a redistribution structure disposed over the first semiconductor die;
a second semiconductor die disposed over the redistribution structure, and electrically connected to the first semiconductor die through the redistribution structure; and
a third semiconductor die disposed over the redistribution structure, and electrically connected to the first semiconductor die through the redistribution structure,
wherein the portion of the first metal layer is vertically overlapped with the second semiconductor die.

* * * * *